United States Patent
Signer et al.

(10) Patent No.: US 6,176,979 B1
(45) Date of Patent: Jan. 23, 2001

(54) METHOD OF MANUFACTURING AN OBJECT IN A VACUUM RECIPIENT

(75) Inventors: Hans Signer, Oberschan (CH); Eduard Kügler, Feldkirch Tisis (AT); Klaus Wellerdieck, Buchs (CH); Helmut Rudigier, Bad Ragaz (CH); Walter Haag, Grabs (CH)

(73) Assignee: Balzers Aktiengesellschaft, Balzers (LI)

( * ) Notice: Under 35 U.S.C. 154(b), the term of this patent shall be extended for 0 days.

(21) Appl. No.: 09/314,333

(22) Filed: May 19, 1999

Related U.S. Application Data

(62) Division of application No. 08/887,091, filed on Jul. 2, 1997, now Pat. No. 5,948,224, which is a continuation of application No. 08/641,707, filed on May 2, 1996, now abandoned, which is a continuation of application No. 08/300,865, filed on Sep. 2, 1994, now abandoned, which is a continuation of application No. 08/020,672, filed on Feb. 22, 1993, now abandoned.

(30) Foreign Application Priority Data

Mar. 24, 1992 (CH) ........................................... 948/92

(51) Int. Cl.⁷ ................................................. C23C 14/34
(52) U.S. Cl. ............................... 204/192.12; 204/192.13; 204/298.08; 427/523; 427/527; 427/529; 427/530
(58) Field of Search .................. 204/192.12, 298.08, 204/298.06, 192.13; 427/523, 527, 529, 530

(56) References Cited

U.S. PATENT DOCUMENTS

| | | | | |
|---|---|---|---|---|
| 5,015,493 | * | 5/1991 | Gruen ................................. | 204/192.12 |
| 5,192,894 | * | 3/1993 | Teschner ............................ | 204/298.08 |
| 5,300,205 | * | 4/1994 | Fritsche ............................. | 204/192.12 |

* cited by examiner

Primary Examiner—Rodney McDonald
(74) Attorney, Agent, or Firm—Notaro & Michalos P.C.

(57) ABSTRACT

A method of manufacturing an object in a vacuum treatment apparatus having a vacuum recipient for containing an atmosphere, includes the steps of supporting a substrate on a work piece carrier arrangement in the recipient and treating the substrate to manufacture the object in the vacuum recipient. The treating process includes generating electrical charge carriers in the atmosphere and in the recipient which are of the type that form electrically insulating material and providing at least two electroconductive surfaces in the recipient. Power, such as a DC signal, is supplied to at least one of the electroconductive surfaces so that at least one of the electroconductive surfaces receives the electrically insulating material for covering at least part of that electroconductive surface. This causes electrical isolation of that electroconductive surface which leads to arcing and damage to the object. A control signal is applied to the electroconductive surfaces during repeating and alternating first time spans and second time spans, for prevent arcing at the part of the electroconductive surfaces which is, or is becoming electrically isolated from the atmosphere by being covered by the electrical charge carriers.

15 Claims, 11 Drawing Sheets

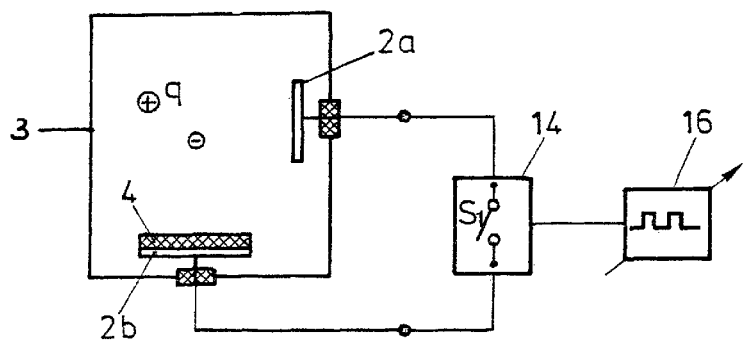
FIG. 3
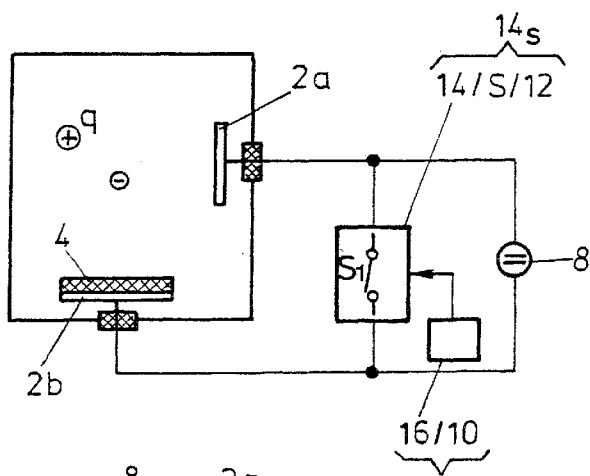
FIG. 4
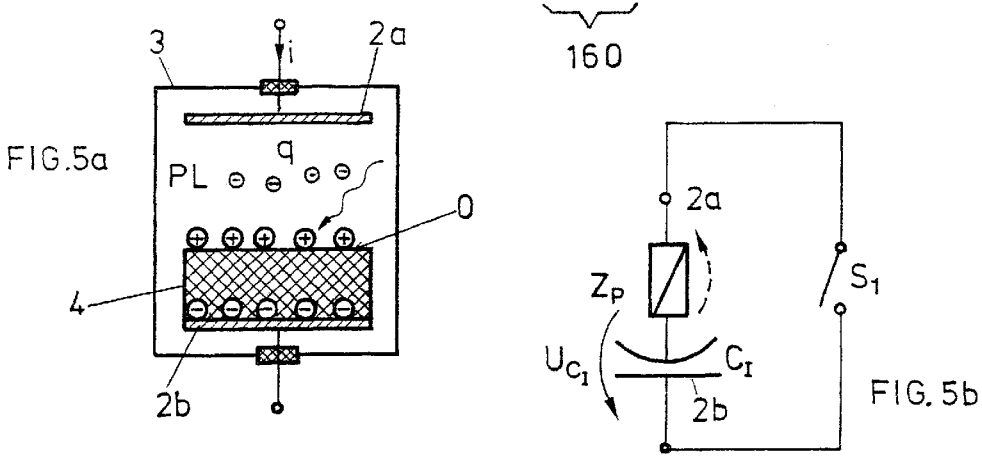
FIG. 5a
FIG. 5b
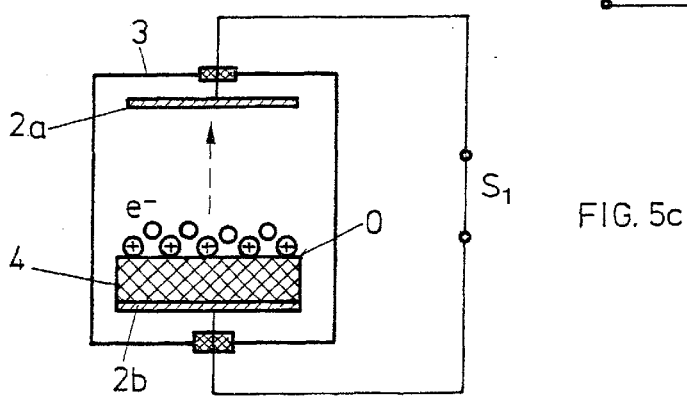
FIG. 5c

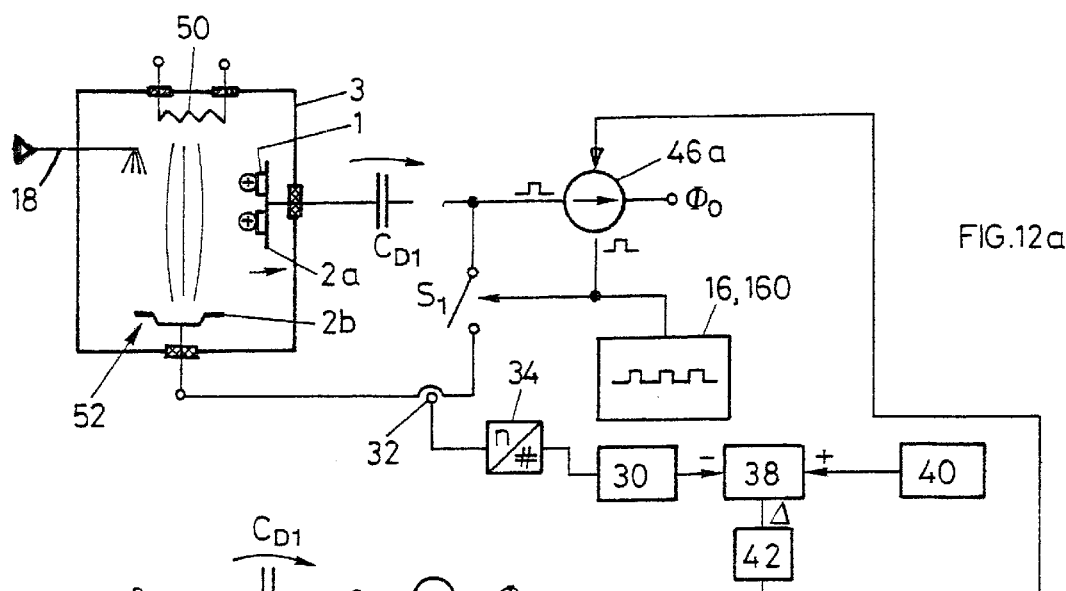
FIG.12a
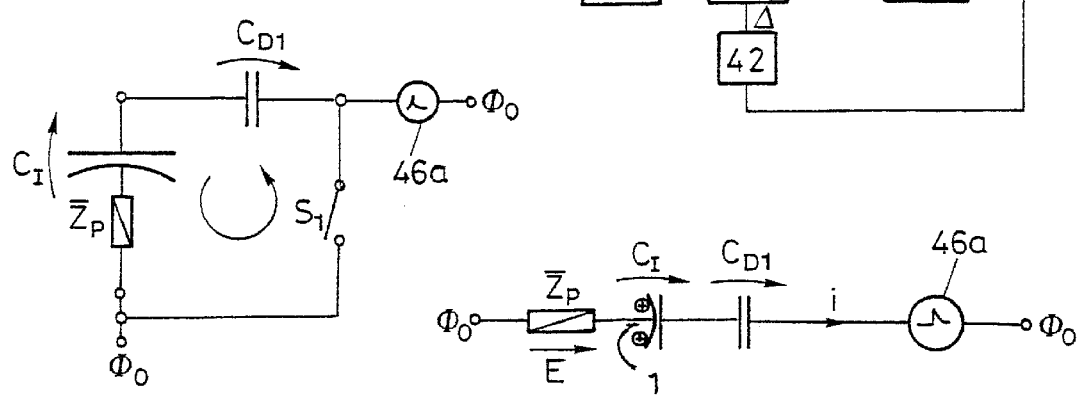
FIG.12c
FIG.12b
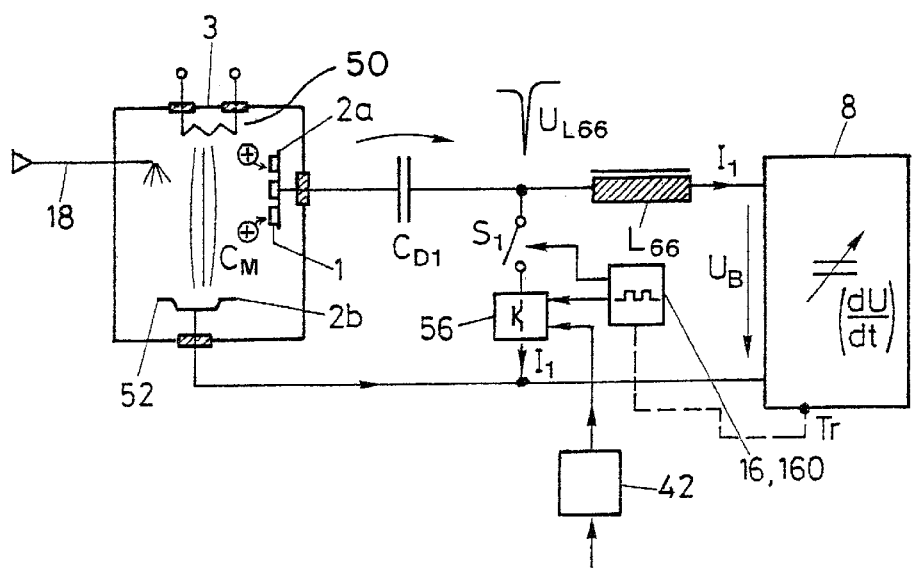
FIG.13

METHOD OF MANUFACTURING AN OBJECT IN A VACUUM RECIPIENT

CROSS-REFERENCE TO RELATED APPLICATIONS

This is a divisional application of application Ser. No. 08/887,091, filed Jul. 2, 1997 and now U.S. Pat. No. 5,948,224, which was a continuation of application Ser No. 08/641,707, filed May 2, 1996 and is now abandoned, which itself was a continuation of application Ser. No. 08/300,865, filed Sep. 2, 1994, and also now abandoned, which in turn was a continuation of application Ser. No. 08/020,672, filed Feb. 22, 1993, and now abandoned, which claimed priority from Swiss patent application 948/92, filed Mar. 24, 1992 and which is related to application Ser. No. 09/314,833.

BACKGROUND OF THE INVENTION

1. Field of the Invention

The present invention is directed to a method of controlling a treatment process for an object in a vacuum atmosphere containing electrical chargecarriers and to a vacuum treatment apparatus. More specifically, the invention is directed to such a method or apparatus wherein at least two surfaces of electro-conductive material are exposed to the vacuum atmosphere at least one thereof being at least in part covered with material of lower electro-conductivity than the material of said one surface to form a resultant exposed surface.

The invention may be implemented for all physical vapor deposition treating processes, reactive PVD-processes as well as to all plasma-enhanced CVD-processes. It may also be implemented to other treatment processes if the two surfaces with the covering are exposed in such a process to a vacuum atmosphere with electrical chargecarriers. Such treatment processes are especially reactive or not reactive sputtering by which workpieces are sputter etched or are sputter coated and are thereby biased on predetermined electric potential or are connected to an electric reference potential or are operated on a floating electrical potential.

The present invention is also especially directed to ion-plating treatment processes which are reactive or not reactive. It may also be implemented to evaporation processes, e.g. to electron beam evaporation processes, arc evaporation processes, evaporation processes with heated crucibles, all such evaporation processes being possibly part of ionplating processes. Thus, and as repeated, the invention may be implemented to all vacuum treatment processes whereat one of the electro-conductive surfaces is entirely or in part covered with a lower electro-conductive material. This may be caused by the specific treatment process itself or may be due to such a covering at such a surface already provided before the specific treatment process is started as, e.g. if such a covering is a surface oxidation of a metallic part to be exposed to the process.

2. Description of Prior Art, General

It is known that always when electro-conductive surfaces are at least in part covered by a lower electro-conductive material, called an "isolating covering" throughout the following description, and are exposed to the vacuum atmosphere containing electrical chargecarriers, a problem may arise by the fact that the isolating covering will become occupied with electrical chargecarriers. This especially if electro-magnetical force fields are applied to the vacuum atmosphere and/or inhomogeneous distributions of chargecarriers in the atmosphere lead to diffusion-forces in the vacuum atmosphere on such carriers. This may also happen at thermical CVD-treatment processes if chargecarriers are additionally used, e.g. for the activation of a surface to be treated so, e.g. ion or electron bombardment. The occupation by electrical chargecarriers leads to electrostatic charging of the isolating covering like a capacitor up to a degree where such electrostatic fields are established that an uncontrolled discharge occurs, e.g. by break-through or overflash.

Principally this problem was approached up to now in that whenever such surfaces—forming a "oneport" or single port set—were to be fed by electrical energy, as energy generators, AC-generators were applied or a DC-signal generator and additionally, simultaneously and continuously, an AC-signal generator.

In spite of the fact that the problems of uncontrolled discharges, as break-throughs and overflashings only occur stochastically distributed in time and during very short time intervals compared to the treatment process working time, one thus remedied these problems by permanently applying during the entire treatment process working time an AC-generator, be it an impulse-generator, or a RF-generator, etc.

SUMMARY OF THE INVENTION

The present invention departs from the recognition that disturbing phenomena only occur during relatively short time intervals during the overall processing time so that the permanent application of an AC-generator during the overall processing time is in fact not justified if there are options to counteract and avoid the disturbing phenomena by signal control techniques just at the moments and as long as it is necessary to ensure a treatment process to be accomplished, leading to a desired result.

This first object of the present invention is resolved by providing a method of controlling a treatment process for an object in a vacuum atmosphere containing electrical chargecarriers which comprises the steps of:

providing at least two surfaces of electro-conductive material, at least one thereof at least in part covered with material of lower electro-conductivity than the material of said one surface to form a resultant surface;

exposing said surfaces forming an electrical oneport with said resultant surface to said vacuum atmosphere;

connecting an electrical DC-signal to said oneport;

controlling the occupation of said covering by electrical chargecarriers by applying in time intervals a further electrical signal to said oneport, said further electric signal being different from said electrical DC-signal; and applying said electrical DC-signal during said treatment process considerably longer than said further electric signal.

By this method additionally to the DC-signal generators may be applied to generate the further electric signal in a controlled manner just at moments and just as long as considered necessary i.e. during significantly shorter time intervals, then the DC-signal for the treatment process is applied. This leads to the fact that such additional signal generators may previously be experienced by experiment.

According to the invention, the actual degree of occupation of the isolating covering by chargecarriers may be monitored in real time and dependent on the result of such monitoring, the further electrical signal may selectively be applied.

Thus, and under this first aspect of the present invention it is avoided that a "dangerous" occupation by electrical chargecarriers occurs in spite of electrical DC-feed to the two electro-conductive surfaces.

Departing from the above mentioned recognition the invention has the second important object to counteract the electrostatic effects of an occupation by electrical chargecarriers of the isolating covering in the case that occupation is a desired result of a treatment process as is especially the case for ionplating. Thereby the electrostatic negative effect of such an occupation shall be counteracted and the occupation of the isolating covering with the material of the electrical chargecarriers shall be maintained as the desired result of such a process.

In this way, problems of stochastic discharge shall be resolved independent from whether electrical energy is externally supplied to the two electro-conductive surfaces considered—the oneport—or not.

This is resolved by a method of controlling a treatment process for an object in a vacuum atmosphere containing electrical chargecarriers which comprises the steps of:

providing at least two surfaces of electro-conductive material at least one thereof at least in part covered with material of lower electro-conductivity than the material of said one surface to form a resultant surface;

exposing said surfaces forming an electrical oneport with said resultant surface to said vacuum atmosphere;

repeatedly applying to said oneport in time intervals one of with a predetermined and of with an adjustable repetition rate at least one of a short-circuit and of a source of electrical charge by means of a controlled discharge or charge exchange current path bridging said oneport.

A most typical example in which inherently to the treatment process an occupation by electrical chargecarriers is desired, is ionplating mentioned above. In ionplating processes ions are deposited from the vacuum atmosphere onto a workpiece surface so as to build up a desired coating. Thereby these ions are driven to the said workpiece surface by means of electric field applied to the vacuum atmosphere. Due to this iondeposition which is inherent to ionplating processes it was up to now not possible to grow coatings of not or low electro-conductive material by such ionplating or to deposit coating onto not or low-conductive surfaces of workpieces be it of non or bad conductive material or of conductive material. This because controlled influencing the electrostatic fields resulting from the desired occupation of the isolating covering with charge carriers, was not possible.

Thus, ionplating as an important process to which the present invention is implemented is a process at which a) by means of an externally applied one directional electric field in the vacuum atmosphere ions are to be deposited on the surface of a workpiece which necessitate external application of a desired electrical potential to the workpiece.

b) the occupation of the said surface with electrical chargecarriers is not to be counteracted because then the target of ionplating would not be reached.

By combining the two methods mentioned above some treatment processes and especially ionplating processes under the said isolating covering condition become inventively possible.

This is realized by a method of controlling a treatment process for an object in a vacuum atmosphere containing electrical chargecarriers which comprises the steps of providing at least two surfaces of electro-conductive material at least one thereof at least in part covered with material of lower electro-conductivity than the material of said one surface to form a resultant surface exposing said surfaces forming an electrical oneport with said resultant surface to said vacuum atmosphere connecting an electrical DC-signal to said electrical oneport controlling the occupation of said covering by electrical chargecarriers by applying a further electrical signal to said oneport said further electrical signal being different from said electrical DC-signal applying said electrical DC-signal during said treatment process considerably longer than said further electric signal and applying in time intervals said further electrical signal by applying repeatedly at least one of a short-circuit and of a source of electrical charge to said oneport at least one of with a predetermined and of with an adjustable repetition rate by means of a controlled discharge or charge-exchange current path bridging said oneport.

As was mentioned above isolating covering of the mentioned kind may be coverings which have been formed independently from the treatment process or as an undesired or desired effect during such process. Such undesired effect may be caused by uncontrolled reaction of contaminating gases in the vacuum atmosphere and deposition of their reaction product onto surfaces which are exposed to the vacuum atmosphere. An independently formed covering may be a contamination layer on electro-conductive surfaces which has been generated before the treatment process is started so e.g. by surface oxidation of a metallic surface or by a previous coating. The said isolating covering may as was stated also be formed inherently to the treatment process so e.g. at coating processes of not or low electro-conductive surfaces and/or when coating surfaces with layers of not or low electro-conductive materials whereby in latter case the isolating covering is grown by the process.

For treatment processes at which process, inherently, bad or low conductive materials are not concerned it is common to operate oneports between two metallic surfaces in the vacuum atmosphere by applying electrical DC-signal be it e.g. for generating a plasma discharge between such surfaces or for biasing workpieces, screens, electrodes etc. In spite of the fact that at such processes, as was mentioned, bad or low electro-conductive materials are not concerned it is known that e.g.on metallic surfaces previously exposed to normal atmosphere a contamination layer is built up as especially an oxidic layer. If such surfaces are then applied to the mentioned processes their results, at the start of such a process and as well known to the man skilled in the art, stochastical discharge phenomena as discussed above which are tolerated because the provision of an AC-signal generator just for counteracting these initial phenomena would not be justified. Nevertheless electrical sources and generators and other electronic devices coupled to the process apparatus are significantly loaded by such initial discharge phenomena be it electrically and/or mechanically and/or thermically and must be accordingly dimensioned, protected or frequently replaced.

It is just this problem which is resolved by the method mentioned above under the first aspect of the present invention without the necessity of providing expensive AC-generators.

Summarizing, the present invention thus proposes under its first aspect to resolve the problem to become able to apply DC-signal generators in cases in which up to now only combined DC- and AC-generators were used respectively dimensioned for continuous operation.

Under the second aspect the present invention resolves the problem to become able to deposit onto isolating coverings electrical chargecarriers and thereby to neutralize the electrical charge thereof without significantly interfering with the deposition of the material of the electrical chargecarriers.

COMPARISON OF THE INVENTION AND OF PRIOR ART

From the U.S. Pat. No. 4,692,230 a method is known by which in a cathode sputtering process from magnetron sputter sources electro-conductive as well as isolating target material are intermittently sputtered. With the sputtered off material a workpiece is coated. It is most relevant that in time-spans during which electro-conductive target material is sputtered this is performed by DC-sputtering. When the non-conductive target material is sputtered this is performed by means of a continuous train of monopolare impulses output from an AC-generator. These operating modes are applied intermittently.

The U.S. Pat. No. 4,693,805 describes a process for sputter coating departing from dielectric target objects or for reactive sputter coating, for sputter etching etc., thus treatment processes in which inherently not or badly electro-conductive materials are involved and form isolating coverings.

So as to control the electrostatic charge occupation of such isolating coverings at a target cathode- and anode-arrangement there is installed an additional oneport formed between the said target cathode and a third auxiliary electrode.

The two oneports, at which the target object forms a common electrode, are electrically fed from respective DC-signal generators via electronically controlled series resistant element formed by transistors. They are fed intermittently with specifically shaped signal-forms so that in the one cycles the electric potential at the target object leads to its sputtering and in the other cycles the occupation by electric chargecarriers at the said target is removed by building up a removing electric field at the auxiliary oneport.

Whereas the latter U.S.-patent removed the occupation by electrical chargecarriers by means of an additional "suction circuit" the DE-A-31 42 900 follows the approach to realize intermittently with ionizing cycles neutralization cycles during which built up chargecarrier occupations are electrically neutralized.

For an ionplating treatment process the DE-A-31 42 900 provides a low voltage glow discharge between a glow cathode and an anode. During ionizing cycles the glow plasma-discharge is initiated and material evaporated from a crucible as substantially electrically neutral material is ionized and is accelerated onto the negatively biased workpiece. In the neutralizing cycles the plasma-discharge and thus the generation of ions is interrupted and the electrons generated at the glow cathode are used to neutralize the electric charge formed by the ionsurface occupation of the workpiece surfaces. By means of accordingly tailored circuits the glow discharge plasma is operated by means of a triggered circuit.

The EP-A-0 101 774 proposes a technique to avoid for a glow plasma-discharge which is operated in the "abnormal" mode that it transits into the arc discharge mode. With respect to definition of these operating modes reference is made to the U.S. Pat. No. 3,625,848 FIG. 1. Thereby there is provided for the glow discharge a current measurement and there is further provided a resistance element so as to limit the discharge current as an arc is about to occur. By this measure an already prevailing arc discharge between the glow discharge electrode is extinguished.

The EP-A-0 062 550 proposes to operate a reactive treatment process by a pulsed glow discharge. To become able to adjust the work piece temperature by means of the temperature of a treatment furnace independently from the plasma discharge there is generated a "cold" plasma by lowering the electrical energy fed between subsequent impulses to such an amount that the plasma discharge is just not extinguished.

From the DE-A-33 22 341 it is further known to counteract the danger that at a glow discharge which is operated at high discharge voltage the discharge mode transits in an arc discharge mode (see also EP-A-0 101 774) and that a disadvantage of a plasma discharge operated by DC-current is that the pressure of the treatment vacuum atmosphere and the temperature therein are mutually dependent. The problem is resolved by intermittently operating the glow discharge respectively with impulse spikes for initiating the discharge and with subsequent time-spans of voltage with a value which just suffices to maintain the glow discharge. Thereby treatment processes are to be performed which are customarily operated by DC-generated glow discharges.

The object of the U.S. Pat. No. 3,437,784 is again to prevent a glow discharge to transit into the arc discharge mode with local arc between the electrodes. This is reached by feeding to the glow discharge oneport a two-way rectified signal of mains-frequency whereby the amplitude of the half-waves is so selected that during the one half-wave cycles the glow discharge is initiated and in the other half-wave cycles it is switched off. Thereby ions which are about to be generated in the discharge path of an arc discharge about to occur may recombine. If the extent of time-spans, according to the half-wave time-spans during which the feeding signal is below a discharge generating level, do not suffice for recombination, there is generated by means of a mechanically operated synchronious rectifier formed by a series switch arrangement separation of the feeding voltage from the glow discharge oneport between subsequent glow discharge initiating cycles.

The U.S. Pat. No. 4,863,549 describes an RF etching process in which the glow discharge is RF-operated and the sputtering ioncurrent on the workpiece is adjusted by a medium frequency signal (90 to 450 kHz) whereby it is reached that the amplitude of the medium frequency signal is not to be adjusted by applying an impulse number modulation technique.

From the EP-A-0,432,090 a reactive ionplating process is known at which a glow discharge is operated between a glow cathode and a crucible with the material to be evaporated and wherein the evaporated material is ionized.

A workpiece carrier is operated with a pulsating DC-voltage with respect to electric reference potential be it anode or cathode potential of the glow discharge. With the pulsating operation of the oneport with the workpiece carrier apparently especially good ceramic coatings at the workpieces are achieved.

The pulsating DC-voltage is generated as a modulatable square impulse train by means of an impulse generator provided therefor.

From the DE-PS-37 00 633 it is finally known to operate a glow discharge or an arc discharge by means of DC-current square impulses from an impulse voltage source. This to avoid undesired thermical loading of the workpieces.

Looking back to the present invention:

By means of the inventive methods and especially due to the resulting controllability of electrical chargecarrier occupation, principally novel treatment processes become possible. Already under its first aspect the present invention is not limited to replacing well known electrical feeding by a simplified feeding. Nevertheless already installed apparatus with DC-signal operation may be easily amended, by providing a module which realises the invention, to become able to operate treatment processes which would not work or would hardly work without this additional module with DC-signal operation. This e.g. due to initial disturbances by oxidic layer on metal surfaces to be treated.

It is a further object of the present invention to realise the inventive method as simply as possible.

This is reached by applying the further electric signal by choppering the electric DC-signal. By selectively adjusting the repetition rate and/or the duty cycle of choppering, which is preferably realised by parallel choppering, the efficiency of the treatment process may easily be optimized by applying just during the time-spans necessary and just as often as necessary DC-signal choppering. By coupling a signal with a broad frequency spectrum during optimally short time intervals to the oneport the occurrence of discharge phenomena is prevented thereby only lowering the electric energy fed to the oneport during optimally short time-spans during processing time. By further providing parallel choppering an optimal combination of the invention under its two aspects results namely under the first aspect "DC-signal generator feeding" and "oneport-discharge".

As will be seen at the end of the present description sets of features of the present invention and of combinations thereof are summarized which are considered important.

BRIEF DESCRIPTION OF THE DRAWINGS

The present invention will be better understood and objects other than those set forth above will become apparent when consideration is given to the following detailed description and to the summarizing list of important features thereof. Such description makes reference to the annexed drawings wherein:

FIG. 3 shows in a representation in analogy to that of FIG. 2 the present invention under its second aspect, FIG. 4 show in a representation in analogy to that of the FIGS. 1 to 3 the inventive method and apparatus preferably combining the two aspects of the invention as shown in the FIGS. 2 and 3, FIG. 5a to 5c show schematically and heuristically a oneport in a vacuum treatment atmosphere comprising an isolating covering of not or badly electro-conductive material for explaining the charge deposition mechanism and to explain the electrical neutralization thereof according to the present invention and to further explain the equivalence circuit which is valid for such a oneport at least in a first approximation, FIG. 12a to 12c show a preferred embodiment of the inventive method and apparatus for ionplating with (FIGS. 12b and 12c) respectively the equivalent circuits which are valid for the different operating cycles of the apparatus according to FIG. 12a, FIG. 13 shows a preferred form of realization of the technique and apparatus according to FIG. 12a FIG. 14 schematically shows by means of a functional block/signal-flow-diagram a further preferred embodiment of an inventive method and apparatus according to FIG. 12a or 13 respectively, by which the electrical charge deposition is controlled during operating cycles of ionplating.

DETAILED DESCRIPTION OF THE INVENTION AND OF BEST MODES OF REALIZATION

Figure 1A:
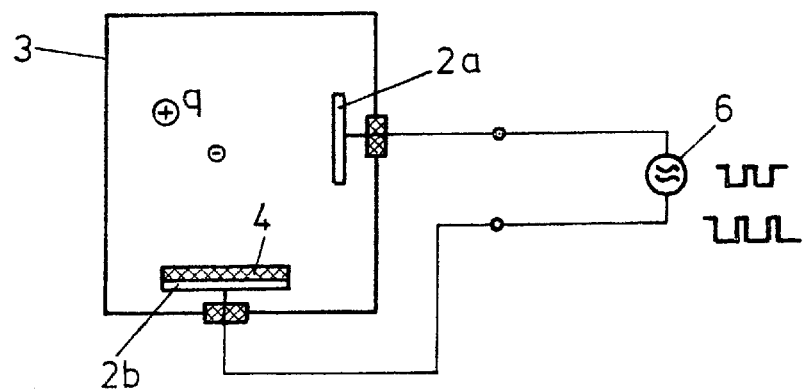
FIG. 1a and 1b show schematically functional block diagrams of respectively known methods or apparatus for electrically feeding a oneport formed between electro-conductive surfaces in a vacuum treatment atmosphere provided with an isolating covering.
Figure 1B:
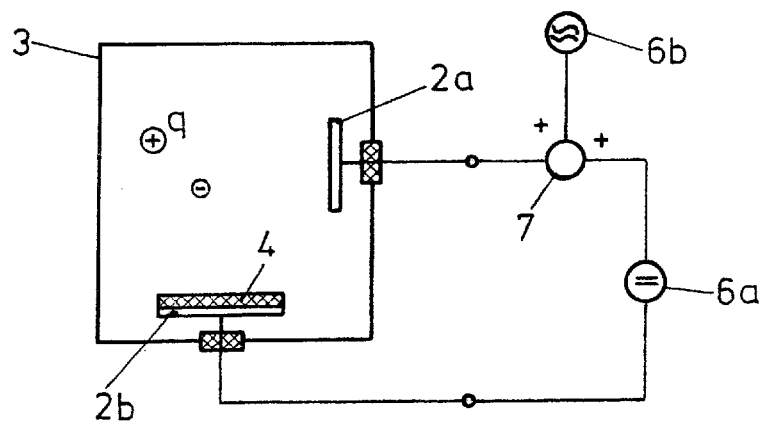

FIGS. 1a and 1b show prior art methods and accordingly prior art apparatus.

In a vacuum recipient 3 a vacuum atmosphere is confined with carriers of electrical charge q. Electroconductive surfaces 2a and 2b, and thereby the area of atmosphere between these surfaces, are electrically operated so that an electric field becomes effective between the two surfaces. Thereby at least one of the two surfaces 2a and/or 2b is at least in part covered with material being of low electroconductivity which will be referred to during the following description as an "isolating covering".

The isolating covering may thereby be a contamination covering independent from a treatment process performed in the recipient, as e.g; an oxide layer on a metal surface, or may be a coating which has before been applied to an electro-conductive surface, which layer is made of material of low electro-conductivity, i.e. of non-conductive or low conductive material. Further, the isolation covering may be generated during a treatment process performed in the recipient, by which a coating of the not or low electro-conductive material is deposited. Such a coating generated during the process considered may be the target of such a process or may be a contamination layer which is unwanted, but is anyway deposited during such process.

The two surfaces 2a, 2b and all structure and atmosphere in recipient 3 bridging these surfaces are defined in the following description and claims as a "oneport" or single port set.

The isolating covering is schematically shown with the reference number 4. Except the case where the isolating covering 4 is a contamination layer, as e.g. the said oxidic layer on a metallic surface, which e.g. was formed at normal atmosphere, such a oneport between two input tabs to the surfaces 2a and 2b is in a first embodiment customarily operated with an AC generator 6, i.e. a generator which generates an at least substantially sinusoidal output signal or, as schematically shown, which generates an output impulse train, possibly with varying duty cycle.

For such conditions FIG. 1b shows a further known approach by which the output signal of a continuous AC generator 6b is superimposed as shown at 7 on the output signal of a DC signal generator 6a. This approach is selected because by applying a unipolar electrical field between the electroconductive surfaces 2a and 2b an occupation layer of electrical chargecarriers will deposit on the isolation covering. E.g., at a negatively biased surface 2b positive electrical chargecarriers, ions, will deposit and there will result, as will be further explained, a voltage across the isolating covering 4. As soon as such voltage reaches respective limit values according to the local conditions along such isolating covering, local and spontaneous discharges occur, generally called arcing here, be it across and through the isolating covering, be it along its surface and on the electroconductive surface 2b and/or to other neighbouring accordingly electrically polarized parts within the recipient 3.

Figure 2:
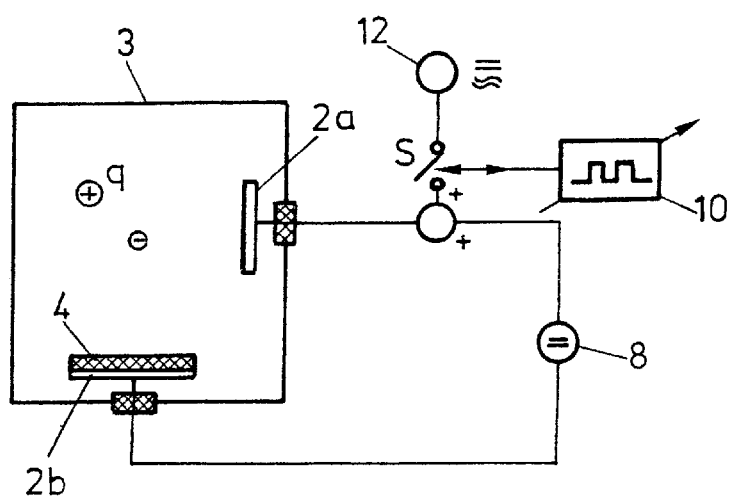
FIG. 2 shows by means of a schematic functional diagram the principle approach according to the present invention and an electric feed according to FIG. 1a or 1b under a first aspect of the present invention.

In FIG. 2, a first principle inventive approach is shown in schematic form and, accordingly, an inventive apparatus. Here the oneport formed between the surfaces 2a and 2b must be electrically fed, this according to a desired operation for a desired treatment process within recipient 3.

The surfaces 2a and 2b are inventively fed by a DC-signal-generator 8. A further electrical signal is superimposed to the output of the DC-signal generator 8 with a predetermined or adjustable repetition-rate and/or during predetermined or adjustable time-spans controlled by a timing-unit 10 and, as schematically shown, by a switching unit S. The further electrical signal, generated, as schematically shown, by a signal generator unit 12, is applied to the oneport formed between the two surfaces 2a and 2b at predetermined or adjustable time moments and during predetermined or adjustable time-spans then resulting in an electrical composite signal which is different from the output signal appearing at the output of DC signal generator 8.

The signal generator unit 12 may thereby be a signal generator which is specifically tailored for this specific use. Thus such signal generator may be tailored that, according to repetition rate, at which its output signal is superimposed to the output signal of generator 8, and according to the time-spans during which such a signal remains superimposed, just the specifically necessitated power is delivered to the oneport. As will be shown later, the unit 12 is construed in a preferred embodiment as a passive unit, by which the output signal of the DC signal generator 8 is varied in time and in a controlled manner before being applied to the oneport 2a, 2b.

In FIG. 3 there is shown in an analogue representation the inventive approach and an according apparatus under the second inventive aspect, namely that the oneport 2a, 2b must not electrically be power-fed. This is e.g. the case when one of the two surfaces is to be operated at a floating electrical potential during a plasma discharge process. Inventively in this case, the two surfaces 2a and 2b on at least one thereof the isolation covering 4 is provided, are bridged by a controlled discharge current path, as is shown in FIG. 3 with a discharge switching unit 14, which latter is controlled by a timing unit 16. At this unit 16 the repetition rate, i.e. the frequency at which the controlled current path is controlled at least for short time-spans to become low-ohmic, especially shortened, is predetermined or adjusted. The extent of the time-spans during which the discharge current path becomes low-ohmic and substantially short circuits the oneport is adjusted or predetermined by the unit 16 too.

Neither the repetition rate nor the extent of time-spans during which a discharge current is enabled from the oneport 2a, 2b must necessarily be constant in time during a treatment process considered in the vacuum atmosphere with the carriers of electrical charge q. Both these values may be adjusted dependent from the behaviour of the process and dependent from the kind of process performed in recipient 3.

In FIG. 4 a preferred variant of the inventive method and of an inventive apparatus is shown. Here, the two approaches which were explained with the help of FIGS. 2 and 3, are combined. The unit 14 bridges the oneport and is controlled by time unit 16. Bridging the control switching-unit 14, there is provided the DC signal generator 8.

As becomes evident and in a most advantageous manner, the unit 14 is operated as well as a switching unit for closing the controlled discharge current path and, additionally, operates as the switching unit S of FIG. 2 by means of which the output signal of the DC signal generator 8 is varied. Thus, the timing unit 16 simultaneously operates as the timing unit 10 and 16, according to FIGS. 2 and 3, and further the unit 14 itself operates as unit S and unit 12 of FIG. 2.

In this combined function, the control unit 14 will be referred to by the reference $14_S$ and the timing unit 16 will be referred to by the reference number 160.

The principle, namely that by the present invention under both of its aspects, but especially under the second one, shall now be explained heuristically by means of FIGS. 5a to 5c.

In FIG. 5a there is schematically shown the vacuum recipient 3 and therein, in the vacuum atmosphere, electrical charge-carriers q, which are e.g. and especially generated by a plasma discharge PL. The two inventively operated surfaces 2a and 2b of electroconductive material are shown and the isolating covering 4. The surface O of the isolating covering 4 shall become occupied by positive ions.

There is generated at the surface of the isolating covering 4 adjacent to the surface 2b a layer of electrical charge, which is oppositely equal to the charge occupying surface O. Thereby, the isolating covering 4 forms the dielectric of a capacitor $C_I$ which is shown in the equivalent circuit of FIG. 5b. One plate of this capacitor is formed by the surface 2b, the other plate by the surface O which is disposed adjacent to the vacuum atmosphere, which is due to the electrical chargecarriers q, electrically conductive. The vacuum atmosphere between surface O and electroconductive surface 2a may be considered in the equivalent circuit by the impedance $Z_P$, whereby, and at least as a first approximation, this impedance may be further considered as ohmic. This because the movable electrons in the vacuum atmosphere lead, at least in first approximation, to proportionality of electric field and displacement of chargecarriers.

Inventively, namely according to the second aspect of the present invention according to FIG. 3, the oneport 2a, 2b is intermittently and substantially shortened.

If electrical charge-carriers according to FIG. 5a have deposited on surface O, then a voltage $U_{CI}$ is generated across the capacitor $C_I$ as shown in FIG. 5b. If the oneport is shortened by means of switching unit $S_1$, according to the unit 14 of FIG. 3, then the Kirkoff-law must still prevail, the sum of all voltages along the discharge current path and the oneport must be zero. Thus, the situation as shown in FIG. 5c is rapidly installed: When the switching unit $S_1$ is closed, a voltage as shown in FIGS. 5b and 5c in dashed lines is rapidly installed across the impedance $Z_P$. By this voltage rapidly movable electrons are propelled towards the surface O. Thereby, adjacent to the surface O, there is formed an electrical double layer without substantial variation of the occupation of surface O by the material of the ions, which double layer per se is electrically neutral.

Thus, by closing the switching unit $S_1$, the occupation of surface O by electrical chargecarriers is electrically neutralized, thereby without significantly disturbing the material occupation by ion material, which ions are of significantly lower movability than electrons.

Thereby, problems of occupation of the isolating covering by electrical charge-carriers, as shown in FIG. 5a, which would lead to problems as soon as the voltage $U_{CI}$ across isolating covering 4 reaches break-through or spark-over values which would lead to the said spontaneous arcing, are overcome.

Already here, it shall be emphasized that only by the described approach it becomes possible to apply coatings of material to surfaces which are not or badly electroconductive or on bottom coatings of such material or to apply to electroconductive surfaces not or low conducting coatings, all by electrostatic fields. This besides of the resolution which was described to remedy problems which occur by spontaneous arcing.

The time constant of the electrical discharge or charge exchange-process which occurs when the switching unit $S_1$ is closed, is substantially given by the value of capacitance of the capacitor $C_I$ and the "resistance" values in series thereto, which are substantially given by the movability of the electrons provided in the vacuum atmosphere, according to the impedance $Z_P$. This time constant may obviously be influenced by external measures at the discharge current path as e.g. by providing possibly adjustable resistances. If necessary, the discharge current loop, consisting of the oneport and the discharge current path, which provides in a first approximation for a first order system, may be altered to a system of second order or higher order by adding further impedance elements as e.g. inductivities.

In view of the present invention, it is further important to recognize that the occupation of the capacitor $C_I$ with electrical charge-carriers after a discharge process may be influenced by applying an electrical charge source in the discharge current path, generating a flow of electrical charge in the current path.

Further, and especially in view of an ionplating process, it is important to recognize that during time-spans in which the switching unit $S_1$ is open, one may influence the development of electrical chargecarriers depositing on surface O in an open loop control or even in a negative feedback control manner by externally supplying electrical charge to the oneport as will be explained.

Figure 6:
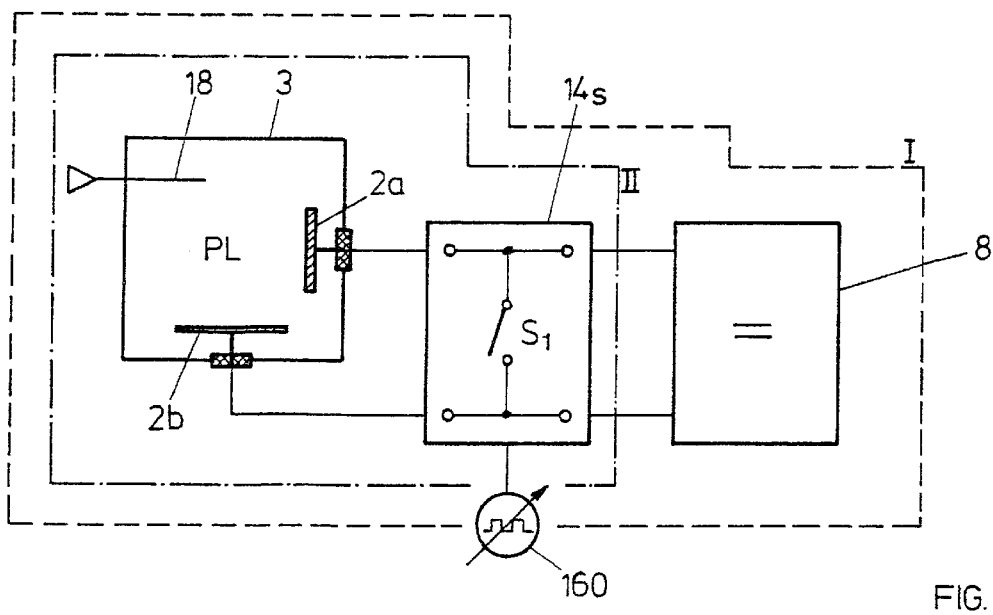
FIG. 6 shows a functional blockdiagram of the inventive method and of an inventive apparatus and of the two aspects of the invention whereby respectively under I and II the two aspects of the invention are denoted as combined according to the teaching of FIG. 6, FIG. 7a to 7c show schematically three examples of inventively adjusting the discharge or charge exchange behaviour of the oneport by external feed of electrical charge, the oneport being represented by its equivalent circuit.

Before proceeding with the description of further preferred embodiments, the concept of the present invention under its different aspects shall be further explained with the help of FIG. 6 taken into consideration the explanations which were given to FIGS. 2 to 4.

In FIG. 6 the inventive method and the inventive apparatus are shown under both aspects and in a preferred form of realization in schematic form. The vacuum recipient 3, wherein in a preferred mode of realization a plasma discharge PL is generated, may be provided with an inlet 18 for a reactive gas or for a reactive gas mixture. Between the electroconductive surfaces 2a and 2b, i.e. bridging the oneport formed between these surfaces, in a first preferred variant of the method and embodiment respectively of the apparatus according to FIG. 4, the unit $14_S$ is provided as a chopper unit. Further, the output of the DC signal generator 8 is bridged by the chopper unit $14_S$ which, thus, acts as parallel chopper unit. The chopper unit $14_S$ is controlled by the time control unit 160 which is preferably controllably adjustable.

The chopper unit $14_S$, preferably construed by electronic switching elements, as with transistors, MOSFET's, TYRATRON's, TYRISTOR's, spark gaps, saturated core-inductors etc., controls the discharge current path of the oneport.

As evident to the man skilled in the art, and as will be specified later, measures may be taken to avoid shortening the output of DC signal generator 8 when the switching unit $S_1$ of the chopper unit $14_S$ is closed.

Under the first aspect and as framed under "I" in FIG. 6 in dash lines, the invention comprises the simple combination of a DC signal generator 8 and of a short circuiting chopper unit $14_S$ by which the oneport between the surfaces 2a and 2b at the vacuum treatment apparatus are electrically operated. Thereby a customary vacuum treatment apparatus provided with a DC signal generator may be retrofitted in simple manner, namely by providing the chopper unit $14_S$, so as to become able to perform vacuum treatments which would not or hardly be possible by means of the mere DC signal operation.

Under the second aspect "II", the present invention proposes to exclusively provide a chopper unit $14_S$ provided between two surfaces which are not electrically power-fed by a generator. One of which is e.g. disposed on a reference potential, as on ground potential, the second customarily operated on floating potential, whereby the electric potential of the latter electrode results from the distribution of electric potentials in the vacuum atmosphere. At such oneports, too, it may be of great advantage to reduce the effect of electrical charge-carriers occupating the floating electrode, which influence the floating potential of that electrode. Thus, the inventive discharging with the help of the chopper unit $14_S$ is considered per se as an inventive part of the present invention. This part of the present invention is shown within dash-dotted lines at II.

Figure 7A:
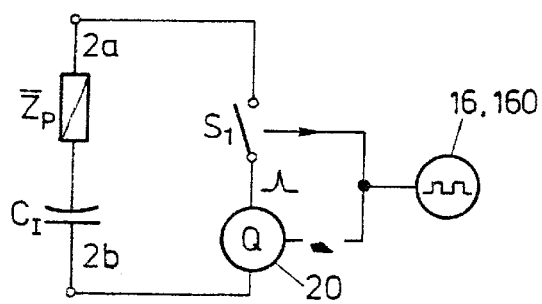

In FIG. 7a provision of a source of electrical charge in the inventive discharge current path according to FIG. 5 is shown. The source of electrical charge becomes effective to the oneport 2a/2b during time-spans in which the discharge current path is closed, i.e. when the switching unit $S_1$ is closed.

There is provided in the discharge current path, e.g. one source 20 of electrical charge Q, which is realized e.g. by a current impulse source. The source is triggered, as schematically shown, and at least substantially in synchronism with closing of the switching unit $S_1$ by the timing unit 16 or 160 respectively, depending therefrom whether the configuration shown in FIG. 7a is implemented in the manner shown in FIG. 3 or is implemented in a combined configuration as principally shown in the FIGS. 4 or 6.

By closing the switching unit $S_1$ electrical charge of predetermined polarity is fed to the capacitor $C_I$ and the occupation of surface O with electrical charge according to FIG. 5a is risen or lowered. Thereby especially the discharge-or charge neutralization-process may be shortened, in that, and in the extreme, the entire charge occupation prevailing at surface O, i.e. at the capacitor $C_I$ is neutralized by the charge fed from source 20 at the very beginning of the time-span during which switching unit $S_1$ is closed.

Figure 7B:
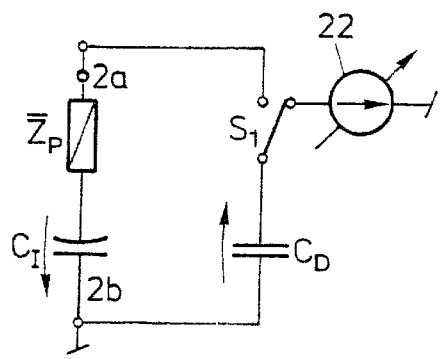

In FIG. 7b a first variant is shown for externally influencing the charge of capacitor $C_I$ in a controlled manner. When the switching unit $S_1$ is open, a discrete capacitor $C_D$ is loaded by a current source 22 in a desired polarity and to a desired amount so as indicated, e.g., in FIG. 7b.

When the switching unit $S_1$ is closed the resulting discharge or charge exchange process is governed by the values of capacitant at $C_I$ and $C_D$ and from the respective charging conditions as initial conditions, as is clearly known to the man skilled in the art.

If, in the time-spans in which $S_1$ is opened, the charge which is built up on $C_I$ is monitored, then it may be neutralized by the charge source, formed according to FIG. 7b by current source 22 and capacitor $C_D$. In the one time-spans the loading condition of the capacitor $C_I$ is monitored, in the other time-spans this loading resulting from occupation of surface O with electrical chargecarriers, especially positively charged ions, is neutralized.

Possibly, the switching unit $S_1$ may be omitted.

Figure 7C:
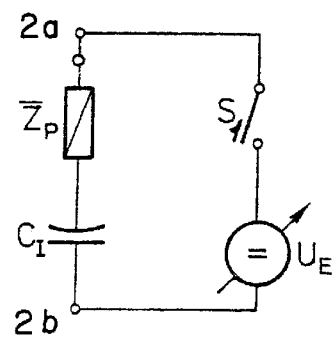

According to the preferred embodiment of FIG. 7c, there is introduced into the discharge current path a voltage source $U_E$ so that the discharge process is governed by the difference between the voltage at capacitor $C_I$ and the voltage $U_E$. Thus, by adjusting the value and the polarity of the voltage $U_E$, the discharge or charge exchange process at capacitor $C_I$ may be influenced. In a preferred mode the discharge process is thus accelerated in that a predetermined remaining voltage at capacitor $C_I$ is reached quicker compared with the case where the oneport is just short-circuited.

An important advantage of the inventive discharge or charge exchange process is that such discharging or charge exchanging may be monitored by measuring. This is realized in a preferred way by a current or a charge measurement at the discharge current path. As an example, this shall be explained with the help of FIG. 8.

Figure 8:
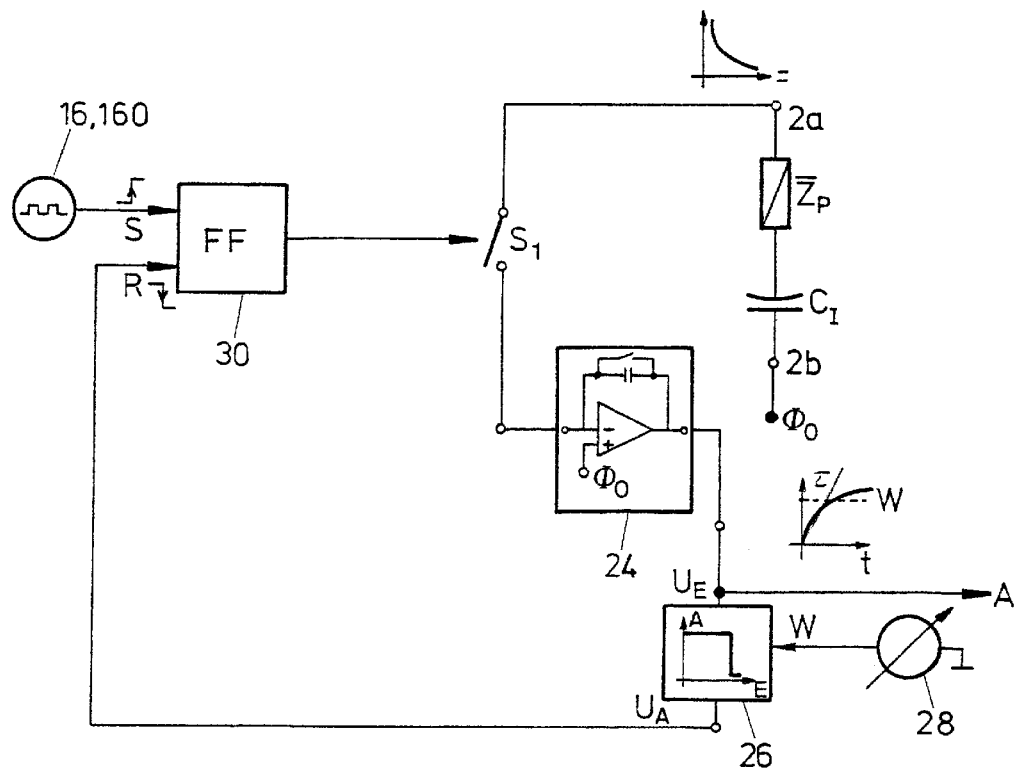
FIG. 8 shows a functional block/signal-flow-diagram of a preferred embodiment of the inventive method and apparatus according to which the discharge behaviour of the oneport is monitored and the discharge time-span is automatically optimized.

According to FIG. 8 the surface 2b of electroconductive material of the oneport 2a, 2b is laid on electric reference potential $\Phi_o$. The oneport is further connected to the switching unit $S_1$ to the inverting input of a current or, as shown, charge amplifier 24 of known construction. As further shown, as an example, the differential amplifier provided is connected with its positive input to the reference potential $\Phi_o$. When the switching unit $S_1$ is shut or closed there appears at the output of the measuring amplifier 24 the time integral of the discharge current as schematically shown over the time axis t. As shown at reference No. A the measuring result of the discharge or charge exchange process may be further exploited for a variety of objects which shall be later discussed.

The output signal of measuring amplifier 24 is preferably led to a comparator unit 26 to which a threshold value W is fed generated by a threshold-value generator 28. As soon as the output signal of the amplifier 24 reaches the threshold value W selected, which indicates that the discharge process has dropped to an accordingly predetermined value, e.g. a bi-stable element 30 is reset, which latter opens switching unit $S_1$. The bi-stable element 30 may thereby be set by the rising edge of the output signal of time unit 16 or 160 which closes the switching unit $S_1$.

This results in the fact that the discharge time-span is automatically adjusted to be only of that extent which is necessary to reach a desired state of charge at capacitor $C_I$. Thereby only smallest possible time-spans are blocked from processing time, the remaining time is still available, especially for process energy feeding from the DC signal generator 8 in the configuration according to FIG. 4.

As obvious to the man skilled in the art, the time constant $\tau$ of the discharge process is significantly dependent from the capacitance value of capacitor $C_I$. Whenever the invention is implemented for coating a workpiece with an isolating covering as by reactive coating, the capacitance value of $C_I$ drops as thickness of such a coating increases.

Figure 9:
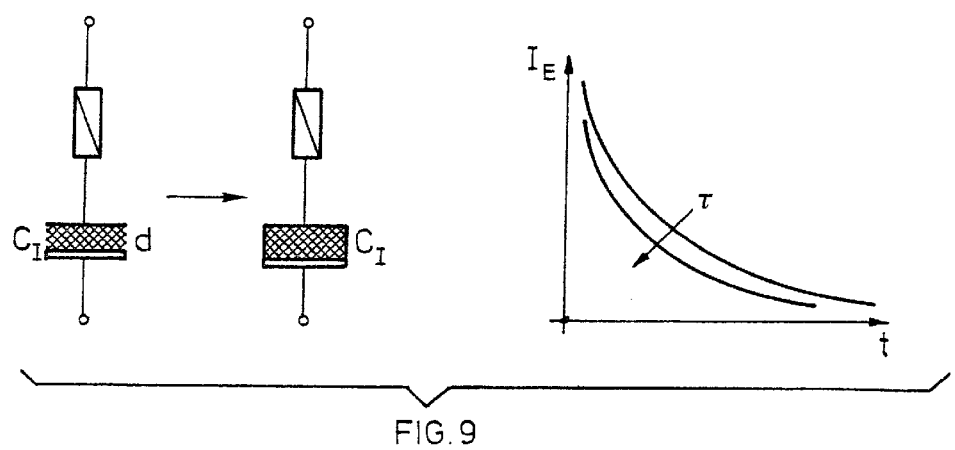
FIG. 9 shows schematically the influence of raising thickness of a not or badly electro-conductive coating on the electro-conductive surface of the inventively considered oneport on the discharge time constant.

Thus, and as schematically shown in FIG. 9, by exploiting the signal A of FIG. 8, the diminishing discharge time constant may be exploited to get information about the increasing thickness d of such coating which leads to information about the time-course of coating growth.

Figure 10:
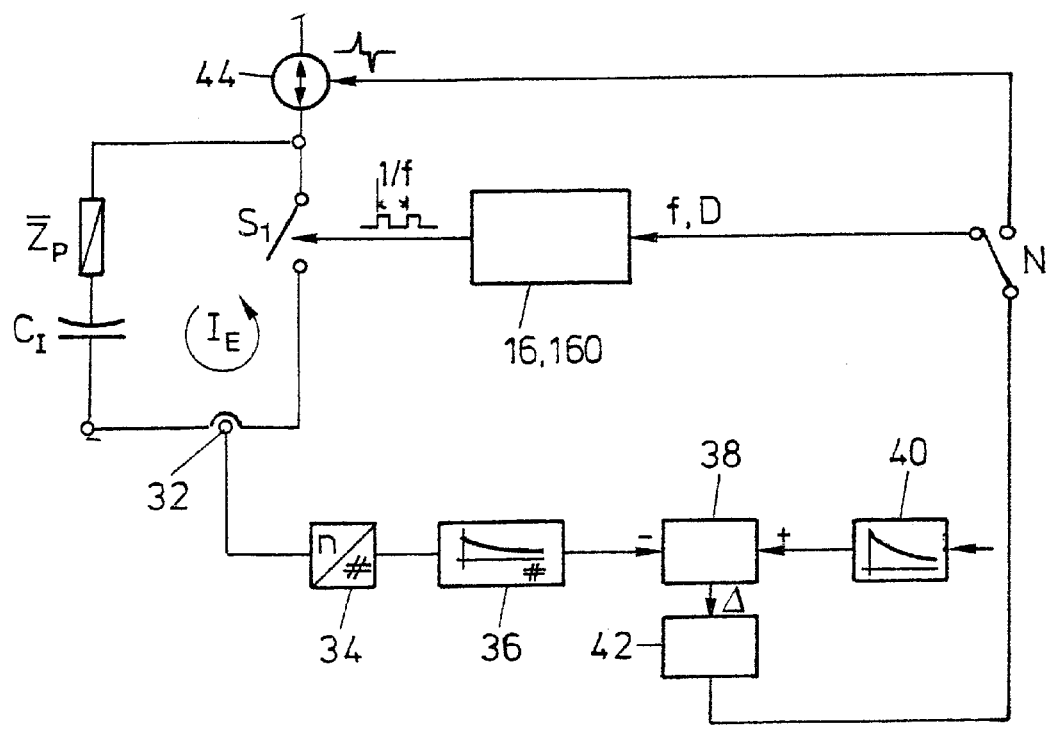
FIG. 10 shows a further embodiment of the invention according to which the discharge behaviour of the oneport shown by its equivalent network is monitored and compared with a rated behaviour and discharge repetition rate and/or discharge time-span is adjusted by negative feedback control technique and/or electrical charge, fed to the oneport respectively.

In FIG. 10 a further embodiment is shown according to which the actual discharge-characteristic is monitored, is then compared with a rated characteristic and, according to the result of this comparison and in the sense of negative feedback control, the switching unit $S_1$ is so operated so that the actual discharge characteristic is negative feedback controlled to substantially follow the rated characteristic. As schematically shown, this is realized in that the discharge current $I_E$ is measured by a current detector 32. A voltage value according to the current measured is e.g. digitalized with the help of an analog to digital converter 34. The digitalized measuring signal is stored in an actual value storage unit 36. The content of the actual value storage unit 36 is compared at a comparing unit 38 with a rated discharge characteristic, which latter is stored in a rated value storage unit 40.

An evaluation unit 42 evaluates differences Δ between the rated values and the actual values. The output of the unit 42 acts on one hand on source 44 of electrical charge which is invertable with respect to its polarity, so as to affect the respective charging state of the capacitor $C_I$ when the switching unit $S_1$ is opened and thus influencing the charge occupation of surface O according to FIG. 5a. On the other hand, the output signal of unit 42 is led to a control input of timing unit 16 or 160 so as to enlarge or reduce the repetition rate of triggered discharge processes and/or to vary the duty cycle of an impulse train at the output of unit 16 or 160 controlling the switching unit $S_1$. The two possibilities to feedback the output signal of unit 42 are schematically shown in FIG. 10 by the throw-over switch N.

If by appropriate control of the charge source 44, the actual discharge characteristics become vanishing, this means that the occupation with electrical chargecarriers of surface O has been neutralized by the action of charge source 44. This, too, may be achieved by the negative feedback control 30, shown in FIG. 10.

Thereby, and as an example, the circuit may be operated cyclicly as follows:

a) Opening of $S_1$; source 44, drives electrical charge on $C_I$ which charge results in chargecarriers from the vacuum atmosphere depositing on surface O, e.g. namely positive ions.

b) Switching unit $S_1$ remaining open: source 44 is invertedly operated for short time, the charge occupying surface O of positive ions is electrically neutralized by electrons.

c) Switch unit $S_1$ is closed, the discharge current $I_E$ is measured; depending on the remaining magnitude and polarity of the measured discharge current neutralizing in repeated step b is adjusted and/or the deposition of chargecarriers on surface O controlled in step a) is adjusted in a negative feedback control loop.

The effect of external application of a source of electrical charge to the oneport as e.g. of source 44 in time-spans, during which the switching unit $S_1$ is open, will be further explained. This especially in connection with ionplating of workpieces as one important part of the present invention.

By influencing the state of electrostatical charge at capacitor $C_I$ and/or on the repetition rate of discharge and/or the extent of discharge time-spans, one may influence the occupation of surface O with electrical chargecarriers in a negative feedback controlled manner, so that, as long as the capacitance value of capacitor $C_I$ remains substantially constant in time, the discharge characteristic and thus the said occupation with chargecarriers is maintained substantially on a rated value. This even then, when the discharge time constant varies with varying capacitance value of $C_I$. In this case one may evaluate the instantaneous value of that capacitance from the discharge time constant and then from the value of that capacitance thus found and by the initial value of the discharge process conclude on the occupation of surface O by chargecarriers, especially by ions.

Figure 11:
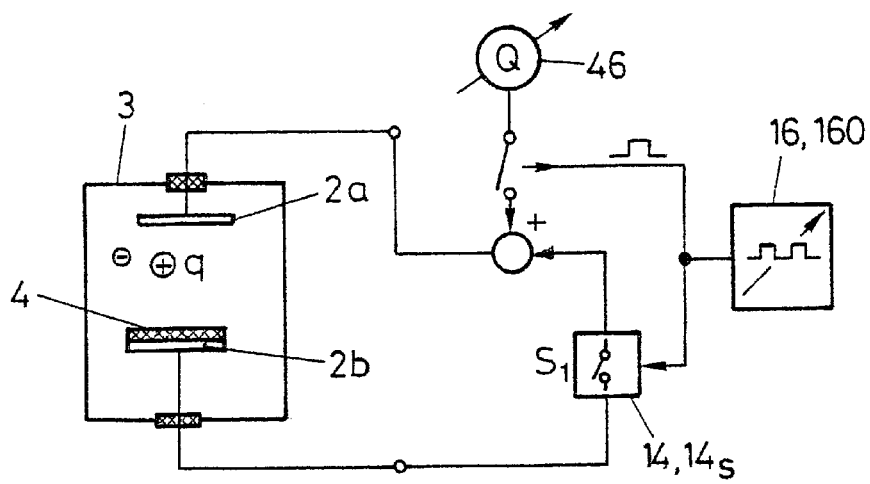
FIG. 11 shows by means of a functional block/signal flow diagram principally the inventive method and apparatus for adjusting the occupation with electric chargecarriers on an isolating covering which latter being formed on one of the two electro-conductive surfaces of the inventively controlled oneport.

According to FIG. 11, and departing from the representation of FIG. 3 or from a combined configuration according to FIG. 4, according to one important aspect of the present invention, in time-spans in between subsequent discharge time-spans, the occupation of the isolating covering 4, according to FIG. 5*a*, with electrical chargecarriers may be adjusted in an open control loop manner or in a negative feedback closed loop control manner.

Therefore, attention is again drawn to FIG. 5. If in FIG. 5 an electrical charge is enforced externally to the oneport comprising the surfaces 2*a* and 2*b* then, clearly, capacitor $C_I$ is charged. If, and according to current direction convention, in a current i which accords with an electrical charge per time unit is fed, this results in an increase of the charge occupation by positive ions at the isolating covering 4. If the current direction is inverted, this results in a decrease of occupation by electrical charge, i.e. results in positive ions being removed from the surface O and or electrons being drawn towards said surface. Attention shall be drawn to the fact that it is customary that the direction of current i is defined opposite to the direction of electron current.

Thus, by external feeding a current or an electrical charge to the oneport, the occupation with electrical chargecarriers of the isolating covering may be controlled. This is of predominant importance, especially for all those treatment processes in which just by such an occupation with chargecarriers and with the corresponding occupation with material, a coating shall be built up which is especially the case in ion- plating process. There, ions out of the vacuum atmosphere are controllably deposited on the surface of a workpiece by means of electrostatic forces.

For this object, according to FIG. 11, when the switching unit $S_1$ is opened at the unit 14 or 14$_S$ according to the FIGS. 3 or 4, by means of the timing unit 16 or 160, a flow of electrical charge is generated through the oneport 2*a*, 2*b*, as is shown in FIG. 11 schematically by the charge source 46 which is enabled synchronously with switching unit $S_1$.

Thereby, at the said treatment processes and especially at an ionplating process, the deposition of a layer or coating on the non or badly conductive surface of a workpiece or the deposition of a layer or coating made of non or badly conductive material on either conductive or not conductive surfaces of a workpiece may controllably be influenced, be it controlled in open loop manner or in negative feedback controlled manner.

In FIGS. 12*a* to 12*c*, schematically, a preferred variant of this inventive method is shown and respectively of a preferred apparatus. In the recipient 3, material is evaporated from a crucible 52, e.g. by means of a plasma discharge. This may be done by means of an arc discharge to crucible 52 or by electron beam evaporation of material in the crucible 52 or, as shown, by means of a glow discharge, especially by a low voltage glow discharge generated between an electron emitter cathode, so e.g. a glow filament cathode 50 and crucible 52. It is clear that material may also be evaporated by heating the crucible or may be sputtered. It is only of predominant importance that the material in the atmosphere is ionized, whereby it is of less importance how the source of that material is construed and by which process the material is freed into the vacuum atmosphere. Further, such a process may be operated in a reactive gas atmosphere, so that the material freed in the vacuum atmosphere first reacts with a reactive gas before depositing or such process may be non-reactive.

Through the gas inlet 18 and according to the embodiment shown, a working gas is inlet to the vacuum recipient 3, at least comprising reactive gas, which reacts in the glow discharge with the material evaporated from crucible 52. Ions are formed. As a reaction product, non or badly electroconductive material deposits in the form of positive ions, thus first forming an occupation of electrical chargecarriers onto one or more than one workpieces 1, which are deposited on one of the electroconductive surfaces, e.g. surface 2*a*, which thus acts as a workpiece carrier surface. The workpieces 1 thereby have either intrinsically an electroconductive surface and are coated by the ionplating process with a coating of non or badly conductive material or such workpieces intrinsically have a surface of non or badly conductive material and are then ionplated with a layer or coating of either non or badly conductive material or of electroconductive material.

The method allows on one hand ionplating with non or badly conductive coatings on all kinds of conductive or non conductive surfaces or ionplating conductive coatings on non or badly conductive surfaces at workpieces, said surfaces being formed either by previously deposited coatings or by the intrinsic surface of the workpiece. Such coating/ workpiece systems could up to now only be realized by ionplating to a very restricted amount. This because the unipolar plating current necessary could not be realized to a sufficient amount and during sufficient time-spans.

Further, the workpieces 1 may be provided in the apparatus according to FIG. 12 or in other configurations which will be described later, with multi-coating systems too. Thereby especially workpieces made of material of any electric conductivity may be provided with a non or bad conductive first layer, especially as a corrosion protective layer, then with a second layer of electroconductive material, especially as a wear resistance layer, or with a combination of such layers comprising more than the said two layers.

For ionplating it is important that the material to be deposited is, as was mentioned, ionized in the vacuum recipient. This may be realized in different manners. Material evaporated by electron beam may be ionized by means of a plasma discharge, as e.g. by an arc discharge on the crucible. For arc evaporation or glow discharge evaporation, ionization occurs by means of the plasma discharge itself. Alternatively or additionally electrons or ions may be fed into the vacuum recipient which improve or lead to the desired ionization. Further, and as was mentioned before, other than reactive processes may be performed if, e.g., the evaporated material shall be deposited as it is freed into the process atmosphere after ionization.

Further, instead of evaporation, the material may be sputtered. If an electroconductive material is sputtered, a sputtering source, as e.g. a magnetron source, may be provided instead of crucible 52. If a non-conductive material shall be sputtered, the sputtering source is preferably operated separately by means of an RF plasma discharge. Thereby the crucible 52 is replaced for implementing of the present invention by an electroconductive surface, independent from the RF discharge as a reference surface in the recipient (see e.g. FIG. 19f).

In every case the conductive surface 2a acting as a workpiece carrier surface is to be connected to an electrical potential so that for ionplating positive ions are accelerated towards the workpieces 1 to form the said occupation by electrical chargecarriers, the positive ions. The electric power which is necessary to be applied at the oneport 2a /2b is significantly lower compared to the electric power necessary for maintaining a plasma discharge which is eventually to be generated in the crucible.

According to the embodiment of FIG. 11, the plating current which is externally applied, accords with the ion and electron propagation in between the electroconductive surfaces 2a and 2b. At least one of the electroconductive surfaces 2a and 2b, preferably that one 2a which acts as workpiece carrier surface according to FIG. 12a, is connected to a discrete capacitor $C_{D1}$. The switching unit $S_1$ closes the discharge current path to the second electroconductive surface 2b. This second electroconductive surface 2b is formed by the crucible in the case of evaporation or by a sputter source in the case of sputtering a conductive or semiconductive material. There is provided a current or electrical charge source 46a (compare FIG. 11) which, when the switching unit $S_1$ is open, as shown in FIG. 12b, appears in series to the discrete capacitor $C_{D1}$, the capacitant $C_I$ and the impedance $Z_P$ of the vacuum atmosphere between the two surfaces 2a and 2b. When the switching unit $S_1$ is closed and as shown in FIG. 12c, the current or electrical charge source 46a is shortened via the closed discharge current path.

This apparatus operates as follows:

In time-spans of ionplating, i.e. in processing timespans, during which a layer is deposited on the workpieces 1, the switching unit $S_1$ is opened. During these timespans an electrical charge, e.g. in the form of a current impulse, is driven through the series connection according to FIG. 12b by the source 46a which is e.g. realized according to FIG. 12b and 12c as a current impulse source. The polarity of the electrical charge fed, according to the time integral of current, is selected as shown. Thus, both the discrete capacitor $C_{D1}$ and the capacitor $C_I$ of the oneport are charged, whereby the electric field E which is generated in the vacuum atmosphere between the surfaces 2a, 2b acts so as to drive positive ions towards the workpieces 1 as shown in FIG. 12b: There is deposited at the surface O of the isolating covering on the workpiece, i.e. on its non or badly conductive surface, an occupation of chargecarriers which accords to the current i which was fed during such plating time interval.

Thereby, it becomes evident that the amount of electrical charge, which is externally fed by means of the source 46a, accords at least approximately to the amount of electrical chargecarriers (ions) which are deposited in these plating time intervals on the workpieces 1. By varying the externally applied electrical charge in the plating time interval, thus, the degree or amount of electrical charge deposition and thus, the grow rate of coating is varied. After or between such plating time intervals, the switching unit $S_1$ is closed as was described above.

The capacitant of the oneport which was described before, as well as the discrete capacitance $C_{D1}$ act initially, as is well-known, as a short circuited element. When the switching unit $S_1$ is closed, the configuration as shown in FIG. 12c becomes valid. The equivalent circuit elements which now appear in parallel, namely especially capacitance $C_I$ and capacitor $C_{D1}$ are first still charged to equally directed voltages as shown in FIG. 12c, so that the discharge process of the discrete capacitor $C_{D1}$ accelerates the discharge or charge exchange process of capacitor $C_I$. The time constant of the overall discharge process is given by the series connection of the two capacitive elements, so that by selection of the value of capacitance $C_{D1}$ significantly larger than the value of the capacitance $C_I$, the time behaviour of the discharge process remains predominantly given by $C_I$ and the impedance $Z_P$.

The charge applied to capacitor $C_{D1}$ is (FIG. 12b) substantially equal to the charge applied to $C_I$ due to series connection, so that the said discharge process, according to FIG. 12c, is in fact accelerated by which the voltages in the parallel configuration of FIG. 12c are brought to equal value when the transient discharge process is terminated.

It is evident that after transient discharge, the voltages at $C_{D1}$ and $C_I$ are, in the parallel structure, oppositely directed and of equal values.

Because, and as was explained above, during the discharge process substantially only the electrical charge of the occupation ions is neutralized and not the occupation with the material particles of the ions, there occurs during the discharge process no significant variation of the ion particle layer which has already been deposited and is now just electrically neutralized.

In FIG. 12a there is shown a further improvement of this preferred embodiment, especially for ionplating. Thereby, and as was already described, the discharge current is measured, the respective measuring signal is possibly analog to digital converted in the converter 34 and is stored as actual value in the actual value storage 30. The content of the storage 30 acting as a data buffer is compared at the comparing unit 38 with the rated value stored in rated value storage 40. Thereby, significant values of the respective actual and rated discharge characteristics are compared.

The evaluation unit 42 evaluates the result of actual to rated value comparison Δ, possibly under consideration of the varying time constant as a function of varying values of the capacitance $C_I$ due to coating thickness increase. In the sense of negative feedback control, the output signal of unit 42 acts on a control input of source 46a so that this source is controlled to adjust the actual discharge characteristic or its significant parameters to at least substantially become equal to the rated discharge characteristic or its characteristic parameters. Thus, it becomes possible to accurately control the growth of layer by adjusting the occupation of the respective surfaces at the workpieces 1, according to surface O of FIG. 5, during time intervals of plating deposition and thereby, additionally, to avoid the occurrence of dangerous voltages across the respective isolating covering 4 according to FIG. 5 with respect to general arcing, by neutralizing the electrical chargeplating deposited during discharging time intervals.

In FIG. 13 a further improvement is shown, namely a very simple form of realization of the technique, which was explained for the embodiment of FIG. 12. Therefrom it will become evident that now the invention is realized under its combined aspect which was explained in connection with FIG. 4.

With respect to the treatment chamber in recipient 3 the same conditions prevail which were described in connection with FIG. 12. The main object is to realize in a most simple way source 46a of FIG. 12. This is done in that the output of the DC signal generator 8, according to FIG. 4, acts via a choke $L_{66}$ on the network which was described in connection with FIG. 12a instead of the source 46a.

The DC signal generator 8 is e.g. poled according to the voltage $U_B$ Of FIG. 13. When the switching unit $S_1$ is closed and first without considering unit 56, a current flows through the choke $L_{66}$ and over the closed switching unit $S_1$. The current which then flows is shown in FIG. 13 at $I_1$. As soon as the switching unit $S_1$ is opened for starting a plating time interval there is generated across the choke $L_{66}$ a high negative voltage impulse, as schematically shown at $U_{L66}$. This voltage-impulse drives through the series connection of $C_{D1}$ and $C_I$, as was explained in connection with FIGS. 12b, the electric plating charge. After this transient caused by $U_{L66}$ the voltage $U_B$ lays commonly across the capacitors $C_I$ and $C_{D1}$. By the choke $L_{66}$ the transient plating process is accelerated in this plating time interval. The operation remains qualitatively the same if the choke $L_{66}$ is omitted and the voltage $U_B$ is directly applied to the series connection of the two capacitive elements $C_I$ and $C_{D1}$ when the switching unit $S_1$ is opened.

Thereby, one must make sure that the DC signal generator 8 is capable to hold its output voltage to rapidly charge the capacitive load which appears at its output.

When the choke $L_{66}$ is provided, e.g. an electronically variable resistance element may be provided in the discharge current path, so e.g. a transistor stage 56, which is controlled from the output of unit 42, according to FIG. 12a, and which varies the current which flows through the choke $L_{66}$ when the switching unit $S_1$ is closed. By varying this current the peak value of the voltage impulse $U_{L66}$ is varied and thus the time behaviour in the transient plating time intervals. By varying the resistance value at the stage 56 to be different in plating time intervals and in discharge time intervals, the stage 56 can be made of no influence during discharge time intervals, i.e. forming a short circuit, or may be used in these time intervals, too, to adjust the transient discharge characteristic. Thereby, the switching unit $S_1$ may evidently be combined with the transistor stage 56, which latter then acts as controlled resistance stage forming the switching unit.

It is further evident that it is absolutely possible to preselect the resistance value of stage 56 without providing a measurement of discharge current and negative feedback, as was shown in FIG. 12a, and thus to adjust the stage 56 e.g. during first adjusting experiments and then to operate the stage 56 just synchronized with the timing unit 16, 160 of FIG. 12.

Figure 14:
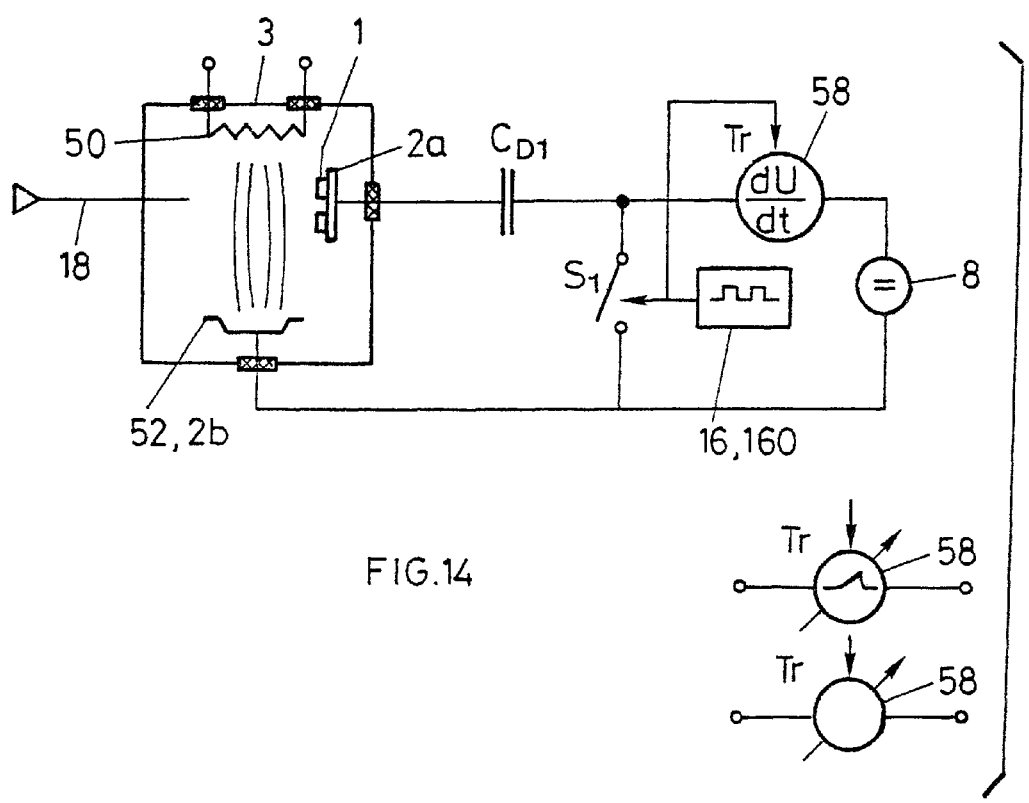

In a further alternative embodiment to that of FIG. 13, FIG. 14 shows a further preferred variant. Thereby, a highly efficient and accurately controlled transfer of electrical charge is realized in plating time intervals, i.e. a highly efficient control of coating deposition in those time intervals. Thereby, to the arrangement of FIG. 12a, there is superimposed to the output signal of DC signal generator 8 a voltage signal as shown with source 58, the output voltage of which having a predetermined or adjustable course with respect to time, i.e. having a predetermined characteristic of dU/dt.

This source 58 is triggered by the output signal of time unit 16 or 160 at a trigger input $T_r$ in the plating time intervals, i.e. when the switching unit $S_1$ is open. As is shown in FIG. 14 at the bottom, the source 58 may generate e.g. a linear or a progressive output ramp or another output voltage curve form with a predetermined characteristic of its time derivative being triggered, according to a desired growth rate of an ionplating deposited layer. Due to the time differentiating characteristic of the series connection of the two capacitive elements $C_I$ and $C_{D1}$ there results from as dU/dt known the corresponding current flow i.e. corresponding electric charge flow per time unit. This time derivative dU/dt may also be applied for source 44 in FIG. 10 as an adjusting value in the negative feedback control loop.

As has already been discussed in connection with FIG. 13, according to FIG. 14 a desired time course of the time derivative may be preselected or may be adjusted within a negative feedback control loop, e.g. by the output signal of a unit 42. Thereby in plating time intervals a desired occupation by chargecarriers is achieved which, as was mentioned, is monitored during the discharge time interval to be readjusted in the said negative feedback control sense. Adjusting the plating current is shown in FIG. 13 in dash lines. Instead of providing an additional triggered voltage source, the output voltage of the DC signal generator 8 is varied in synchronism with the output signal of the timing unit 16 or 160 to provide for desired dU/dt.

The method explained with the help of the FIGS. 11 to 14, is most advantageously combined with an ionplating treatment process. Thereby, a novel ionplating method is created with the ability to apply electroconductive coating on non-conductive surfaces or to apply non-conductive coatings on conductive or non-conductive surfaces.

The method as has been explained with the help of the FIGS. 12 to 14, for controlling the charge occupation of the surface O according to FIG. 5 during plating time intervals is considered per se as an invention which, obviously, may be most advantageously combined with other features described.

Figure 15:
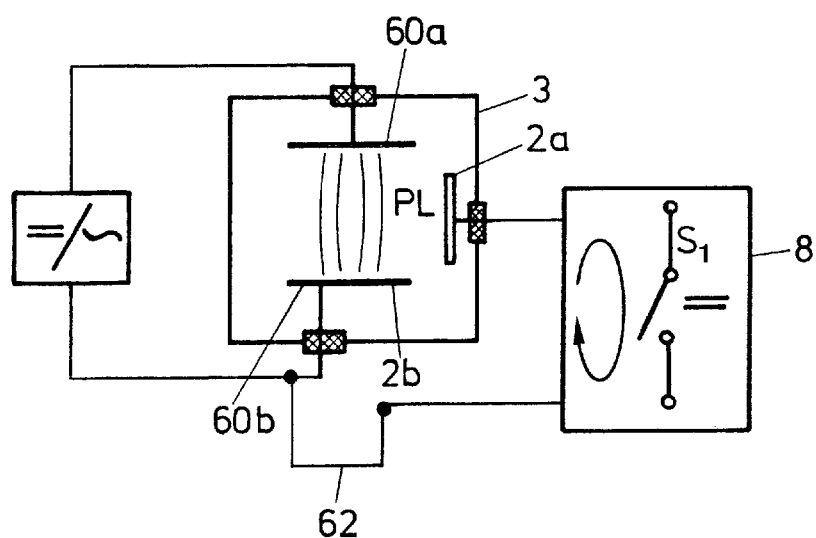
FIG. 15 shows by means of a schematic representation of an apparatus according to the present invention a preferred feeding of a plasma-discharge electrode and of an inventively operated electro-conductive surface by electric potential.

At all embodiments of the inventive method or apparatus at which, according to FIG. 4, the oneport 2a, 2b is fed from a DC signal generator 8 via a chopper unit $14_S$ or via a chopper switching unit $S_1$ and a plasma discharge PL is generated in the vacuum recipient, as shown schematically in FIG. 15 between plasma generating electrodes 60a and 60b, electrical instabilities are avoided in that one of the electrodes loaded with plasma discharge current, as e.g. electrode 60b, is connected to an electric potential at the discharge current path. Preferably one of the inventively provided two electroconductive surfaces of the oneport is further used according to FIG. 15 as plasma generating electrode. This is clearly shown by the connection 62 in FIG. 15.

Figure 16:
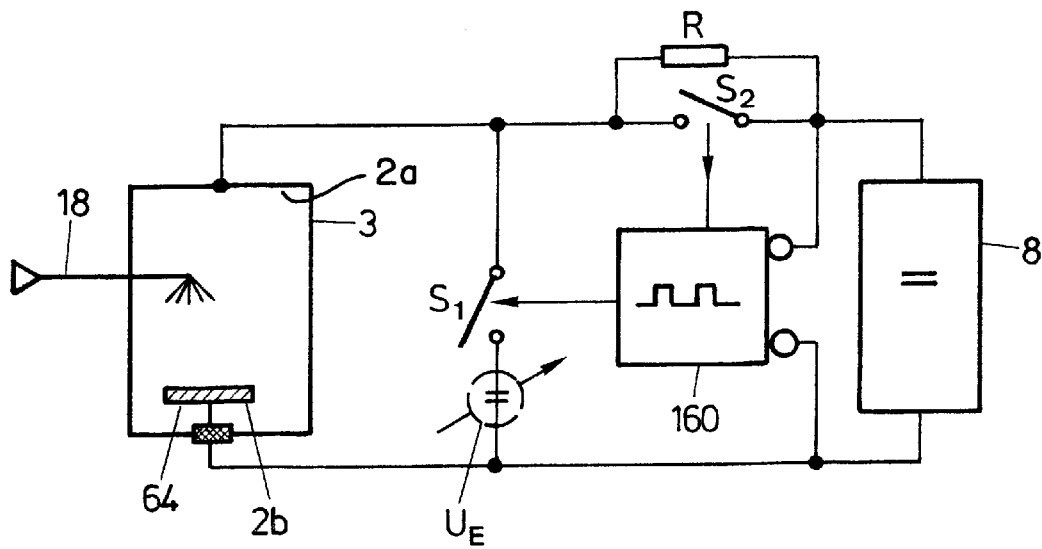
FIG. 16 shows a further preferred embodiment of the present invention for reactive sputtering under the inventive implementation of a DC-signal generator, FIG. 17 schematically shows by means of a functional block/signal flow diagram a further preferred embodiment of the inventive method and of an inventive apparatus according to which the rate of occurrence and/or the kind of occurrence of spontaneous discharge phenomena (breakthroughs, flashovers) in the vacuum treatment chamber are monitored and as a function therefrom the discharge and/or the adjustment of the desired electric charge deposition is performed in a negative feedback control technique according to one aspect of the present invention, FIG. 18 by means of a schematic functional block/signal flow diagram an inventive method and apparatus at which more than one oneport are operated mutually staggered in time.

In FIG. 16 a further preferred embodiment of the inventive method and apparatus is shown. In the vacuum recipient 3 a glow discharge is generated, e.g. between the wall of the recipient 3 and a target 64 of conductive or at least semi-conductive material. By means of a gas feed 18 a working gas with a reactive gas is inlet in the recipient 3. Thus, FIG. 16 shows an apparatus for a reactive cathode sputtering process. The target 64 may be a part of a magnetron sputtering source. The workpieces are not shown in FIG. 16. They are either operated floatingly or are driven at a biasing potential, e.g. as was shown at FIGS. 11 to 14 for ionplating.

The glow discharge in the embodiment of FIG. 16 is operated principally according to FIG. 4. After the explanations which were given, the embodiment of FIG. 16 must not be explained for the man skilled in the art in details. Because the DC signal generator 8 for operating the glow discharge necessitates relatively high output power, when the switching unit $S_1$ is closed by the timing unit 160, thus generated in phaseopposition thereto, a series switching unit $S_2$ is opened, so that the glow discharge current may not flow through the switching unit $S_1$. Especially when the DC signal generator 8 has the output characteristic of a DC current source, the switching unit $S_2$ is preferably bridged by a network, preferably by a resistance network, as is shown at R in FIG. 16, but may also be bridged by an electronic control network as by a transistor network.

Thereby, it is reached that, when switching unit $S_2$ is open, not too high voltages occur across the open switching unit $S_2$.

The measures which have been described before, so e.g. provision of a possibly controlled voltage source $U_E$ according to FIG. 7c to influence discharge process or the measures for measuring the discharge process and accordingly influencing the timing unit 160, as was described with the help of FIG. 8, will be implemented preferably also in this embodiment. Especially the features of FIG. 8 allow in the case of cathode sputtering, e.g. according to FIG. 16, to optimize efficiency of the apparatus in that the discharge timespans are optimally adapted and adjusted to the shortest possible extent.

For the inventive ion plating according to the FIGS. 11 to 14, preferably the output signal of the DC signal generator 8 is varied at a repetition rate according 50 kHz to 500 kHz, preferably of at least 90 kHz, and especially preferably with at least 100 kHz which results in operating the switching unit $S_1$ at the said frequency, i.e. the timing unit 16 or 160. The closing times of the switching unit $S_1$ are thereby preferably selected to be 50 nsec and 10 μsec preferably between 0.5 μsec and 2 μsec or between 2 μsec and 10 μsec, also in dependency from the above mentioned repetition rate selected and from the intended treatment process to perform, especially from the intended ionplating process. If sputtering is performed, as was explained with the help of FIG. 16 as one preferred embodiment, operating frequency of the switching unit $S_1$ according to repetition rate with which the output signal of the DC signal generator 8 is varied is selected preferably to be between 50 Hz and 1 MHz further preferably between 5 kHz and 100 kHz, thereby especially preferably between 10 kHz and 20 kHz (all limits included). Here too, the time interval, i.e. the closing timespans during which the switching unit $S_1$ remains closed, are selected to be between 50 nsec and 10 μsec, preferably between 0.5 μsec and 2 μsec or between 2 μsec and 10 μsec, dependent on the desired treating process and the selected repetition rate respectively.

The inventive method which was described with the help of FIG. 16 is especially suited for generating silicon oxide coatings, i.e. coatings of $Si_xO_y$. The method is extremely suited to be applied in connection with a sputtering cathode of a mixture of indium oxide and tin oxide or of indium and tin, which material being sputtered into an atmosphere containing oxygen to realize a respective coating at the workpieces. The same apparatus may also be used for sputtering instead of a target the surfaces of workpieces, to perform sputter-etching, or to sputter-etch the surface of a target, so as to remove e.g. a contamination layer as e.g. an oxide layer or other undesired depositions.

The reactive cathode sputtering process, as it was described in connection with FIG. 16, may be operated in the oxidic (reactive) or in the transition mode, whereby, and with respect to definition of these operating modes, it is referred to "reactive DC high rate sputtering as a production method" ("Reaktives DC-Hochratezerstäuben als Produktionsverfahren") of S. Schiller et al., speech to the International Conference on Metal Coating, San Diego/Calif., March 1987, Surface and Coating Technology 33 (1987).

Thereby, it has been recognized that with the inventive cathode sputtering method, the transition from the metallic to the reactive mode is considerably less abrupt as is customarily expected. This means that with the inventive method the characteristic of the per se instable transition mode, the so-called intra-mode, becomes flatter than it would be expected, and that thus a process working point is significantly easier to stabilize inventively in this intramode than with other methods by means of negative feedback control.

Figure 17:
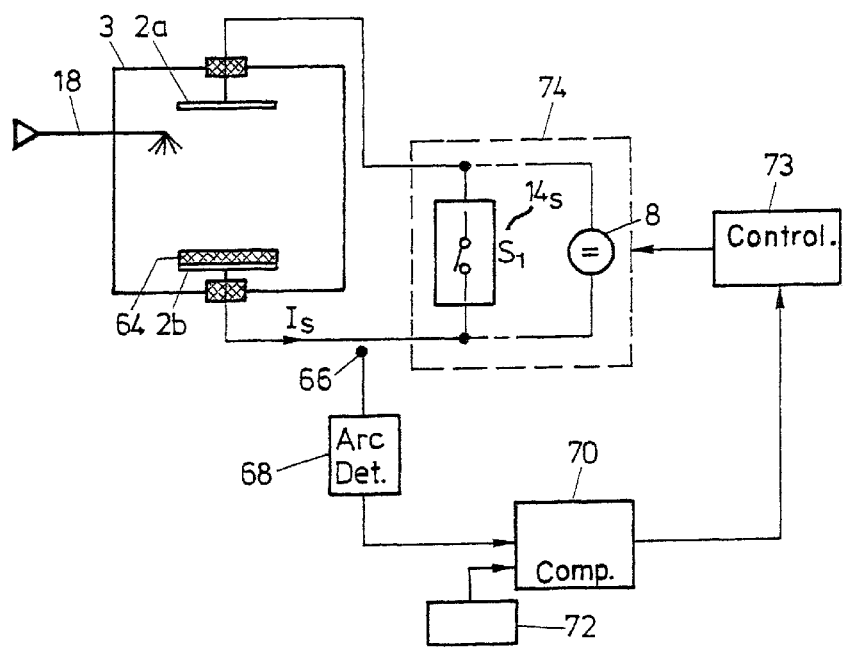

In FIG. 17, a further preferred embodiment is shown which has to be considered in connection with that of FIG. 16. Nevertheless, the embodiment and method according to FIG. 17 may also be implied in connection with ion plating or with other treatment processes. Some further examples shall later be disclosed with the help of FIG. 19. Without limiting, this further improvement is shown in FIG. 17 on the basis of the cathode sputtering method according to FIG. 16.

Instead of measuring the discharge current here and as an example, there is provided a current detector 66 to monitor e.g. the glow discharge current. With monitoring the current $I_s$, the occurrence of stochastical arcing, be it overflashing or breakthroughs, is registered which arcing may be recognized by the occurrence of current spikes superimposed on the discharge current $I_s$. Instead of monitoring the current, stochastic arcing can also be monitored by an optical detector in the vacuum recipient. The characteristic of the current monitored by detector 66 is evaluated in an arc occurrence detection unit 68. The output signal of the arc detection unit 68 is led to a comparator unit 70. Therein it is monitored at which repetition frequency the said stochastic arcing occurs and/or at which intensity which is recovered by analysing the occurrence and the shape of the said current spikes. The evaluated actual characteristic value, be it intensity and/or rate of repetition, is compared in unit 70 with a predetermined rated value for this characteristic value, predetermined at unit 72. The output of unit 70 adjusts via a controller 73 the inventive arrangement framed in broken lines in block 74 of FIG. 17. Thereby, the occurrence of arcing is monitored instead of monitoring the discharge current.

With the controller 73 the repetition rate and/or the extent of timespans during which the switching unit $S_1$ is closed, is controlled via time control unit 16 or 160, this also for a oneport which is not electrically actively fed, in contrary to the embodiment of FIG. 17 for cathode sputtering, i.e. for a oneport with no DC signal generator 8-feed.

If e.g. the occurrence frequency of stochastic arcing is too high, the repetition rate of closing the switching unit $S_1$ is risen and/or the timespans during which the switching unit $S_1$ closes the discharge current path are enlarged. By these features, too, an optimal efficiency is reached, in that the discharge timespans are generated only so often and so long as necessitated by the actual arcing behaviour of the process.

Especially the repetition rate of installing the discharge or charge exchange timespans is adapted to the actual growth of an isolating covering. Thereby, automatically, the efficiency of the processing plant and apparatus is optimized.

Measuring apparatus for detecting the said arcing characteristic in plasma discharges and especially in glow discharges are known.

The just described method of FIG. 17 is preferably applied in combination with a cathode sputtering apparatus as was shown in connection with FIG. 16.

Figure 18:
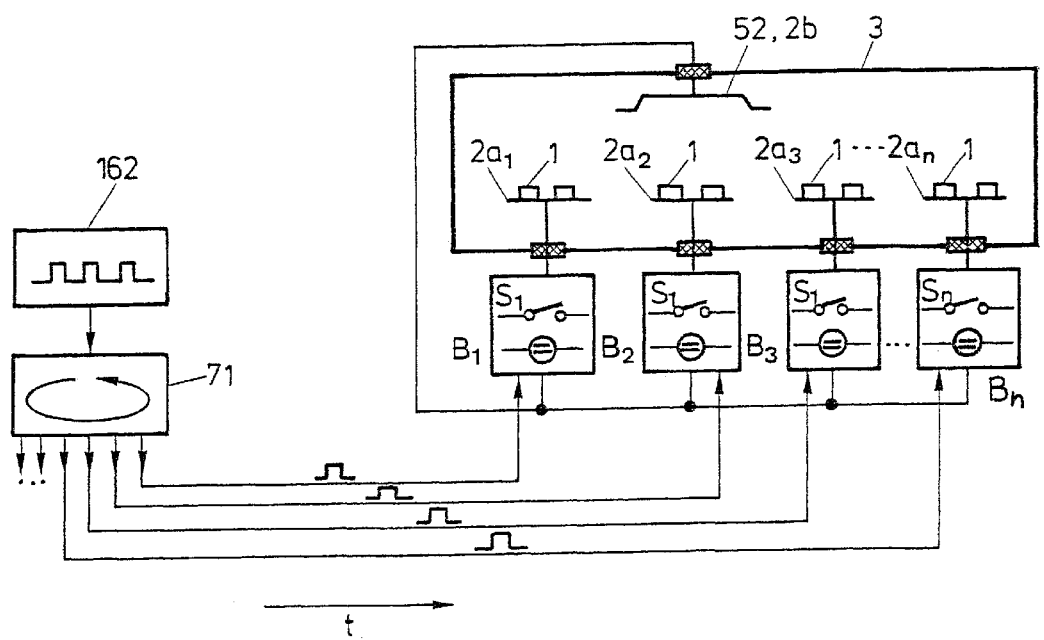

In FIG. 18 a further most important embodiment of the inventive method and apparatus is shown, which is especially important for ion plating according to the FIGS. 11 to 14. Nevertheless, the methods and principles shown here are not exclusively applicable for ion plating. FIG. 18 shows, nevertheless, and without being limiting, such improvement for ion plating as was disclosed in connection with the FIGS. 11 to 14.

In FIG. 18 parts, which were already described in connection with FIG. 12, are referred to with the same reference numbers. In the vacuum recipient 3 there is performed in one of the pre-described manners ionplating, e.g. with an evaporating crucible 52 which forms the one of the two electroconductive surfaces of the inventively exploited oneport. A glow discharge or another plasma discharge according to the description to FIG. 12 is here not shown. Several workpiece carrier surfaces $2a_1, 2a_2, 2a_3 \ldots, 2a_n$ are provided on which workpieces 1 to be ionplated are deposited. The respective pairs of inventively operated electroconductive surfaces $2a_x$ and 2b are respectively and as only schematically shown here operated by an inventive operating block $B_x$, realized as was explained in connection with the FIGS. 11 to 14.

If at such a configuration all switching units $S_1$ schematically shown are simultaneously closed, then significant energy is removed from the treating process and especially from the plasma discharge if the process is operated with such plasma discharge. This leads to instabilities in the process control.

Therefore, and according to FIG. 18, there is provided a supervising time control unit 162 which controls e.g. via a time staggering unit 71, realized e.g. by a shift register unit, each of the units $B_1$ to $B_n$ cyclicly and in a time staggered manner. This is schematically shown on the time axis t by time staggered control impulses to each of the units $B_x$. If it is desired to operate each of the oneports $2a_x/2b$ separately and separately in an optimized manner, then for each of these oneports there is provided a time control unit 16 or 160, according to FIG. 12, and each of the oneports is operated according to the FIGS. 11 to 14, whereby a synchronization unit makes sure that via the timing unit 16 or 160, as shown in FIG. 18, the oneports are discharged staggered in time. It is evident that possibly more than one workpiece carrier surface $2a_x$ may be operated together so as to form groups, which groups of surfaces $2a_x$ are operated in a time staggered manner.

Further, it must be emphasized that with the chopper unit 14 or $14_S$, which has been explained with the help of FIG. 6 and the following figures, a large number of existing vacuum treatment apparatus with DC signal generator feed may be retrofitted so that with such retrofitted apparatus processes become realizable for which, up to now, completely different apparatus and plants were to be used, especially with different generators as was explained in connection with FIG. 1.

Figure 19:
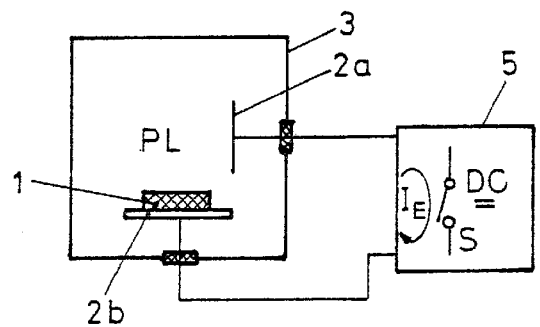
FIGS. 19, 19a to 19h show schematically a number of embodiments of the present invention in different constellations to show how broad the present invention may be implemented.

Thus, with one and the same apparatus treatment processes may be realized which, on one hand, necessitate DC operation and which, on the other hand, could not be realized with DC operation up to now but which apparatus can now be operated for such treatments too by the mere fact that the present invention is implemented In FIG. 19 some possibilities of implementing the present invention shall be further explained, without being complete and without intent of limiting the invention, just so that the man skilled in the art gets the clear idea, where and how the present invention may be applied.

Figure 19A:
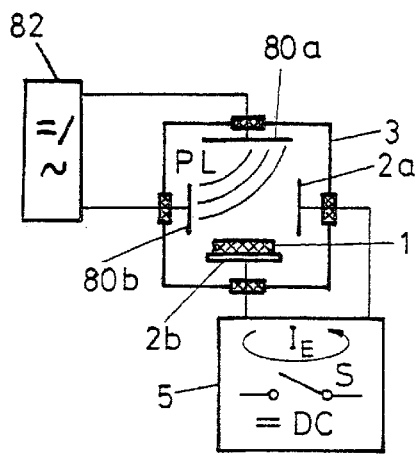

FIG. 19 departs from a workpiece 1 made of non or low conductive material which, thus, forms itself the isolating covering. In the vacuum recipient 3, a plasma discharge PL is initiated in known manner. The workpiece 1 may be subjected to etching or may be coated with a conductive or non-conductive layer, be it by evaporation of electroconductive or non-conductive material, reactive or non-reactive, or sputtering of conductive or semi-conductive material, again reactive or non-reactive. The inventive operational unit, as was described before, is schematically shown with block 5. In FIG. 19a, departing from the general representation of FIG. 19, a plasma discharge is shown between plasma discharge electrodes 80a and 80b, which plasma discharge is generated by a DC or AC current generator 82, specially foreseen to feed the plasma discharge. The treating process may be e.g. ionplating. The inventively operated electroconductive surfaces 2a and 2b are operated independently from the plasma discharge. If e.g. non or low conductive material shall be sputtered, so as to afterwards be deposited in a reactive or not reactive deposition process on the workpieces 1, one may see that the generator 82 is preferably provided as an RF generator in known manner.

Figure 19B:
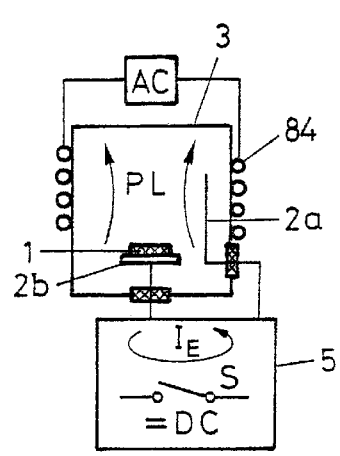

According to FIG. 19b, the plasma discharge PL is sustained by the field of an induction coil 84. With respect to operating the inventively provided electroconductive surfaces 2a and 2b forming the oneport, nothing changes with respect to FIG. 19a.

According to FIG. 19c, again a plasma discharge is maintained between plasma discharge electrodes 80a and 80b, whereby here one of the plasma discharge electrodes, so e.g. the electrode 80b, is used as one of the inventively operated conductive surfaces, e.g. as surface 2a.

Figure 19C:
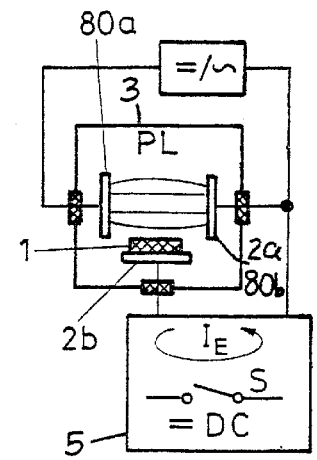
Figure 19D:
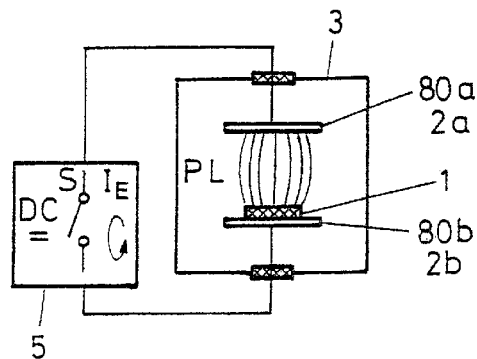

According to FIG. 19d, a workpiece 1 is e.g. etched in a plasma discharge, whereby here the electrodes 80a, 80b respectively form simultaneously the inventively operated conductive surfaces 2a and 2b.

With the plasma discharge according to the FIGS. 19a, 19c, a material disposed on one of the plasma discharge electrodes may be sputtered to be directly deposited on a workpiece 1 or to be deposited on such a workpiece after reaction with a working gas or with parts of such a working gas within the recipient 3. Equally, evaporated material may be ionized with the plasma discharge shown to be deposited by ionplating on the workpieces, be it unreacted or after reaction with a reactive gas led to the vacuum recipient 3. Principally, how the material sources and its ionization are realized in the vacuum recipient are of secondary importance for the present invention. Of prime importance is that workpieces with an isolating covering are treated in a vacuum atmosphere comprising electrical charge-carriers.

One can apply arc evaporation, a so-called rod feed technique, electron beam evaporation, thermical evaporation or sputtering, all reactive or not reactive, and further plasma enhanced chemical wafer deposition (PECVD).

Figure 19E:
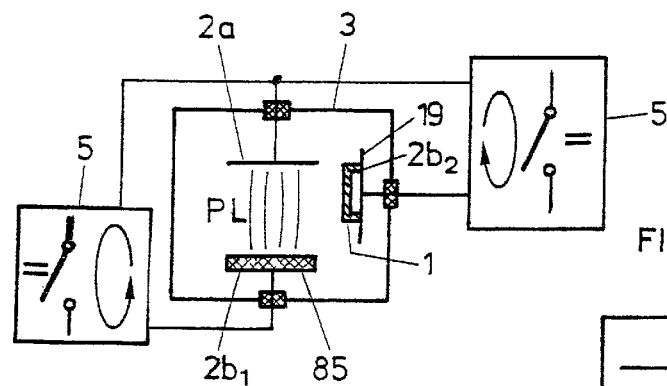

According to FIG. 19e, a target 85 made of electroconductive or at least semi-conductive material is sputtered in the plasma discharge and the sputtered off material is deposited without or with additional reaction with a reactive gas in recipient 3 as an electroconductive or a not electroconductive or low electroconductive layer on workpiece 1. In the first case, the workpiece comprises a non or low conductive surface which may have been realized by previous coating or which is inherent to the workpiece material.

Both, the plasma discharge and the oneport, may be operated between the conductive surfaces 2a and 2b$_1$ as well as between 2a and 2b$_2$ inventively. Principally and preferably, pairs of electroconductive surfaces are inventively operated, whereon deposition of non or low conductive material is to be considered or at which such materials are provided.

Figure 19F:
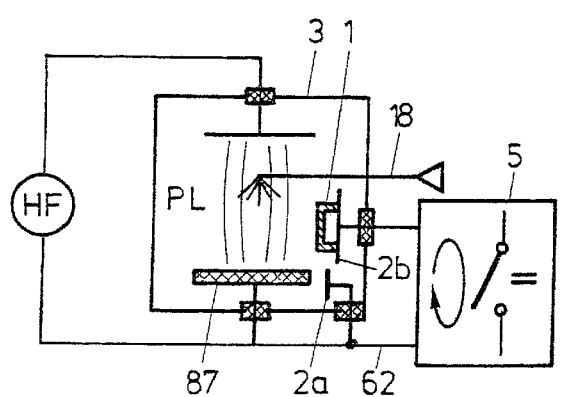

According to FIG. 19f, in a RF plasma discharge non or low conductive material of a target 87 is sputtered and is possibly reacted with a reactive gas inlet through an inlet arrangement 18. A layer of non or low conductive material is ionplated on workpieces 1, whereby in this case the workpiece carrier electrode is formed by one of the inventively operated electroconductive surfaces, 2b, and the second electroconductive surface 2a is provided separate from the plasma discharge.

Figure 19G:
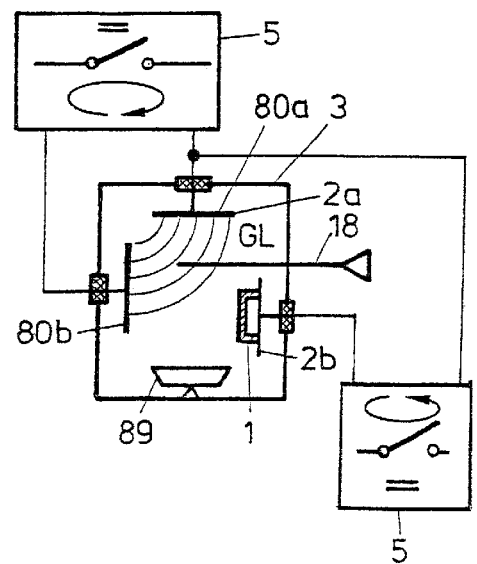

According to FIG. 19g, there is operated a plasma discharge between electrodes 80a and 80b, so e.g. a glow discharge, and there is evaporated material from a crucible 89, an electroconductive material, a not electroconductive material or a material of low electroconductivity. In the plasma discharge the evaporated material is ionized and deposited by ionplating on workpiece 1, so as to form there a layer of respective material. Here too, a reactive process may be operated, in that through the gas inlet 18 a reactive gas is fed to the process-atmosphere.

The glow discharge electrodes as well as the oneport between the two electroconductive surfaces 2a and 2b are inventively operated as schematically shown with the two blocks 5.

Figure 19H:
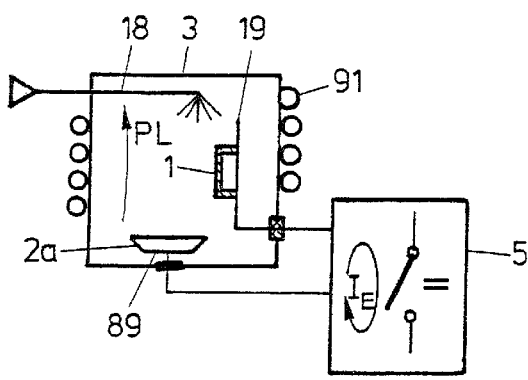

Finally, FIG. 19h shows an embodiment of the invention in analogy to FIG. 19g, whereby here the plasma discharge is generated for ionizing evaporated material by the field coupled into the recipient 3 and generated by an induction coil 91.

The example shown and described may show to the man skilled in the art to which an extent the present invention may be applied.

Example for Inventive Cathode Sputtering:

| | | |
|---|---|---|
| 1) | apparatus: | BAS 450 of the firm Balzers AG, Balzers/FL |
| | cathode: | AK 510 of the firm Balzers AG |
| | magnet system: | MA 525 of the firm Balzers AG |
| | target: | S10-2403 silicon target (5 × 10 inches) |
| | DC power supply: | 10 kW |
| | distance between target and substrate: | 70 mm |
| | rotation-frequency of workpiece carrier: | <0,5 Hz |
| | frequency (repetition rate) of inventive discharge: | 17 kHz |
| | timespan of discharge: | .9 µsec |
| | kind of discharge: | short circuit |
| | sputtering power: | 2 kW |
| | gas pressures in the recipient: Ar: | pAr=8E-3mbar |
| | $O_2$: | pO2=2E-3mbar |
| | DC voltage at the target: in the metallic mode: | −668V |
| | in the working point between metallic mode and oxidic mode: | −340V |
| | coating: | $SiO_2$ |
| | index of refraction $SiO_2$ at λ = 633 nm: | 1,47 |
| | extinction coefficient k of $SiO_2$ at λ = 633 nm: | <1E-5 |
| 2) | apparatus: | BAK 760 of the firm Balzers AG, Balzers/FL |
| | cathode: | AK 525 of the firm Balzers AG |
| | magnet system: | MA 525 of the firm Balzers AG |
| | target: | S10-3976 silicon target (5 × 25 inches) |
| | DC power supply: | 10 kW |
| | distance between target and substrate: | 60 mm |
| | rotational frequency of workpiece carrier: | 0,5 Hz |
| | repetition frequency (repetition rate) of inventively applied discharge: | 17 µsec |
| | time-span of discharge | 16 µsec |
| | discharge conditions: | short circuit |
| | sputtering power: | 2 kW |
| | gas pressures in the recipient: Ar: | pAr=8E-4bar |
| | O2: | pO2=2E-5mbar |
| | DC voltage at the target in the metallic mode: | −660V |
| | in the working point between metallic and oxidic mode: | −550V |
| | deposited layer: | 284 nm SiO2 |

| -continued | |
|---|---|
| energy yield<br>(DDR = deposited volume of coating per energy applied therefor) | DDR(SiO2)=<br>44,6 nm mm 2/Ws |
| index of refraction of the SiO2 at λ = 633 nm | 1,47 |
| extinction coefficient k for the SiO2 at λ = 633 nm | <1E-5 |

Examples for Inventive Ionplating

1. Forming tools were coated in a reactive ionplating process with an apparatus construed as schematically shown in FIG. 12a and according to the embodiments according to the FIGS. 15 and 18. Silicon was evaporated and the tools coated with a silicon nitride coating. The forming tools thus coated with a corrosion resistant layer were afterwards coated with a further hard material coating to make the tools wear resistant.

Therefore, titanium-carbonitride was used for aluminum flanching wheels as forming tools, titanium-nitride for injection mould forms for polyvinylchloride and chromium-nitride coating for metal pressure die casting tools.

Thereby, first, well-known prior art ionplating processes were used.

Only with the implementation of the inventive method to form an inventive ion plating apparatus, i.e. applying a DC voltage and discharging at a predetermined repetition rate, problems were resolved which resulted from the electrically isolated bottom layer (isolating covering) and, especially, a sufficiently adhering abrasion resistant coating could be deposited on the silicon-nitride layer. Only the tools which had been treated by inventive ionplating could be used in practice.

2. It was attempted to coat turn-over cutting plates by known physical vapor deposition procedures (PVD). Thereby, simultaneously aluminum and chromium were evaporated from crucible. Thereby it was recognized that coating layers are on one hand of sufficient hardness, but that the abrasion resistance does not suffice for applications with specially high demands with respect to abrasion.

An analysis of the coating with the raster electron microscope showed that the layers were not sufficiently compact.

Therefore, the same coating was deposited by the inventive ion plating method, whereby and as desired a significant increase of the abrasion resistance was achieved at the turn-over cutting plates.

For mass production according to the two examples given above with more than two workpiece carriers, the apparatus was construed as schematically shown in FIG. 18. It was recognized that a minimal timespan of 10 nsec between discharge timespans applied at the different workpiece carriers was necessary. The operation became especially stable with such time intervals larger than 20 nsec between respective discharge timespans at the different workpiece carriers.

With this method workpieces deposited on a large number of workpiece carrier surfaces could be treated "quasi simultaneously" by inventive ionplating. The apparatus used comprised twelve different workpiece carriers. Thereby, when the turn-over cutting plates were coated, their abrasion resistance became substantially equal to the abrasion resistance of such turn-over cutting plates which had been coated by prior art high temperature CVD methods.

Generally spoken, workpieces which have been inventively ion plated, have a higher ductility than workpieces which have been treated by high temperature CVD methods. This because the inventive ion plating leads to significant lower temperatures during the treating process. The said high ductility which was achieved by the inventively ion-plated turn-over cutting plates, allows such cutting plates to be used in uninterrupted cutting operation.

The following additional and substantial advantages of the invention were recognized:

1. For cathode sputtering:

Besides the advantages which have been already mentioned, that
   - the efficiency of the inventive method and apparatus in the sense of deposited coating volume per applied electrical energy is risen compared with previously known methods,
   - the transition from the metallic mode in the reactive or oxidic mode becomes steadier so that a process working point is easier to stabilize by negative feedback control measures in the said transition mode.

2. For inventive ionplating:

Besides the advantages mentioned above the following advantages were recognized, namely that
   - the adherence of inventively ion plated coatings is significantly improved,
   - the compactness of inventively deposited coatings is significantly increased and thereby the abrasion resistance,
   - the treatment temperature of the workpieces to be treated may inventively be significantly lowered as is known for ionplating. By the fact that ionplating may now be applied due to its inventive improvement there, where up to now it was customary to apply high temperature CVD methods, the ductility of inventively treated workpieces may significantly be increased compared with workpieces equally coated, but by high temperature CVD.

Subsequently and in the form of a sequence of summarizing statements, the most important features and feature combinations of the invention are listed:

The invention considers:

I. A method for treating workpieces in a vacuum atmosphere by which method an electrical signal is applied to at least two electroconductive surfaces, which surfaces are exposed to a vacuum treatment atmosphere and whereby at least one of said two surfaces has a "isolating covering" of not or low conductive material which at least in part covers said surface and whereby the vacuum atmosphere comprises electrical chargecarriers and whereby further the output signal of a DC signal generator is applied to the oneport formed by said two electroconductive surfaces, and wherein further, during the treatment, there is applied a further electrical signal which is different from the output signal of said generator to said oneport at a repetition rate and during timespans of such extent as required by electric charges depositing in the vacuum atmosphere and on said isolating covering and whereby, further, during said treatment the output signal of the DC signal generator is applied considerably longer than the further electric signal is applied.

II. A method for workpiece treatment in a vacuum atmosphere which comprises electrical chargecarriers and whereby at least two electroconductive surfaces are interact with the vacuum atmosphere and at least one thereof is covered at least in part by an isolating covering of not or low conductive material, and whereby the said electroconductive surfaces are at least for short time intervals at predetermined or at adjustable repetition rate shortened and/or are connected to a source of electrical charge via a discharge or charge exchange current path.

III. A method following a method with the features of I and II, whereby further short circuiting and/or applying a source of electrical charge is performed in timespans during which said further electrical signal is applied and whereby at least the isolating covering surface according to (I) forms that one according to (II).

IV. A method preferably realized according to the features of I or III, whereby the further signal is generated by choppering of the output signal of the generator.

V. A method preferably realized according to the features of IV, whereby the further signal is generated by parallel choppering of the output signal of the generator.

VI. A method preferably following one of the sets of features I to V, at which the at least one workpiece
 a) comprises a surface of not or low conductive material as said isolating covering and/or
 b) is coated with a layer of not or low conductive material as said isolating covering by said treatment and the workpiece is deposited on one of said electroconductive surfaces.

VII. A method preferably following the set of features according to VI, whereby on a surface which is formed of not or low conductive material as the said isolating covering, a layer of conductive material is deposited by the treatment process.

VIII. A method wherein preferably the set of features of one of the sets I to VII is applied and whereby the workpiece treatment is an ionplating process.

IX. A method which preferably follows the features of one of the sets I to VIII, whereby further
 a) a conductive material, whereon the said isolating covering is provided independent from the treatment process or is applied during the treatment process, is evaporated or sputtered as source material for the treatment process and/or
 b) a not or low conductive material as a source material, which forms the said isolating covering, is evaporated for the treatment process and the material forms one of said surfaces or is deposited on a conductive one of the said surfaces.

X. A method preferably following one of the sets defined in I to IX, whereby the treatment process is a PVD treatment process or a reactive PVD treatment process or a plasma enhanced CVD treatment process.

XI. A method preferably following the features of one of the sets I to X, whereby further a plasma is generated in the vacuum atmosphere.

XII. A method preferably following the set of features according to IX, whereby further the plasma is fed from one of the said surfaces.

XIII. A method preferably following the set defined in XI, whereby further one of the electrodes from which the plasma discharge is fed, is deposited on the electric potential of one of the said surfaces.

XIV. A method preferably following one of the sets II to XIII, whereby further the discharge or charge exchange behaviour is measured in the current path.

XV. A method preferably following the set defined in XIV, whereby further the thickness of an isolating covering is retrieved from the measured discharge or charge exchange behaviour.

XVI. A method preferably following the set of features as defined in XIV, whereby the actual occupation of the isolating covering by electrical chargecarriers is retrieved from the measured discharge or charge exchange behaviour.

XVII. A method which preferably follows one of the sets of features according to II to XVI, whereby the growth of an occupation with electrical chargecarriers on the isolating covering is measured.

XVIII. A method preferably following a set of features according to XIV to XVII, whereby further the measured discharge or charge exchange behaviour is compared with a rated behaviour and, as a function of the result of this comparison, the covering with electrical chargecarriers of the isolating covering is adjusted by external feeding electrical charges and/or by adjusting the repetition frequency of discharge or charge exchange cycles and/or by adjusting the time extent provided for each discharge or charge exchange step, so that the resultant measured actual discharge or charge exchange characteristic substantially accords to the rated behaviour.

XIX. A method preferably following the features of one of the sets XIV to XVIII, whereby spontaneous break-throughs or flash-overs, generally called "arcing", caused by occupation of said isolating covering by electrical chargecarriers, is monitored or watched and, according to their frequency of occurrence and/or their kind of occurrence the occupation by electrical chargecarriers is open loop adjusted or is negative feedback controlled by varying an electrical charge externally input and/or by varying the repetition rate of discharge or charge exchange cycles and/or by adjusting the time extent of discharge or charge exchange cycles, so that a desired behaviour with respect to the said spontaneous arcing is reached.

XX. A method preferably following the features of one of the sets XIV to XIX, whereby then, when the measured discharge or charge exchange behaviour at least substantially accords with a predetermined behaviour, the respective discharge or charge exchange cycle is stopped.

XXI. A method preferably following a set of features according to one of II to XX, whereby in timespans between discharge or charge exchange cycles a growth of said occupation with electrical chargecarriers is controlled by external input of electrical charge onto that surface with the isolating covering, thus being the surface carrying the electrical chargecarriers deposited on said isolating covering.

XXII. A method preferably following the set of features according to XXI, whereby further the growth of occupation with electric chargecarriers is controlled as growth of a desired layer on at least one workpiece during ionplating deposition of said layer.

XXIII. A method which preferably follows one of the sets of features according to I to XXII, whereby the workpiece surface acting itself as isolating covering is not or low conductive and is coated by ionplating and/or the workpiece surface is coated by ionplating with a coating of not or low conductive material as an isolating covering, and thereby a workpiece carrier surface is one of said electroconductive surfaces, whereby a capacitive element is connected in series to the said carrier surface in the discharge current path, so that during time intervals of ionplating this capacitance and the capacitance formed by the at least one isolating covering at the workpiece appears connected in series and during time intervals of discharge or charge exchange appear connected in parallel, and that during plating time intervals this series connection is electrically charged so that there occurs an at least predominantly pre-set ion occupation on said workpieces.

XXIV. A method which preferably follows the set of features according to XXIII, whereby in time intervals of ionplating a predetermined or adjustable electric charge is fed through the series connection of the said two capacitors and that therewith the occupation with electrical chargecarriers at the workpiece surface is controlled.

XXV. A method which preferably follows the set of features according to XXIV, whereby the said electrical charge is applied by applying a voltage with predetermined time derivative to the said series connection of the two capacitors.

XXVI. A method preferably following the set of features according to XXIII to XXV, further comprising electrically charging said series connection with inductively generated over-voltage.

XXVII. A method which preferably follows the set of features as defined in one of XXIII to XXVI, whereby charging said series connection in time intervals of ionplating occurs with a voltage signal having a ramp-shaped time course and thus with an at least substantially constant electrical current, and that thereby there is realized a substantially constant rate of electric chargecarriers deposition.

XXVIII. A method following preferably a set of features according to one of I to XXVII, whereby further two or more than two pairs of surfaces are provided and each pair or each group of such pairs is provided with a DC signal generator and/or with a discharge or charge exchange current path, each pair or groups is operated mutually staggered in time.

XXIX. A method which preferably follows a set of features according to one of I to XXVIII, whereby workpieces are provided on at least two pairs or groups of said surfaces and are treated by ionplating, and that further the pairs or groups of pairs are subjected in time staggered manner to discharge cycles.

XXX. A method which preferably follows one of the sets of features according to XXIII to XXIX, whereby the discharge behaviour is measured, the measuring result is compared with a rated behaviour and by varying charging the said series connection during time intervals of ionplating as a function of the result of said comparison, the occupation by ions of the workpiece and thus the measured discharge behaviour is adjusted to substantially become equal to the rated behaviour, thereby possibly considering time-variations of the capacitor formed by said one surface, thereon the isolating covering and thereon the occupation by electrical chargecarriers, by considering variations of the discharge time constant.

XXXI. A method which preferably follows a set of features according to one of XXIII to XXX, whereby further the discharge cycle is repeated with a repetition rate or frequency of between 50 kHz and 500 kHz (both included), preferably with at least 90 kHz and even more preferably with at least 100 kHz.

XXXII. A method preferably following the set of features according to one of the sets XXIII to XXXI, whereby on at least one workpiece there is deposited at least one corrosion resistant and/or at least one wear resistant coating by ionplating, so e.g. a not or low conductive first layer as a corrosion resistant layer and an electroconductive second layer as wear resistant layer or further combinations of layers as a system of layers with two and more than two layers.

XXXIII. A method which preferably follows the features according to one of the sets I to XXI, whereby an electroconductive material is sputtered by means of a plasma discharge in the vacuum atmosphere, which plasma discharge is sustained between the material to be sputtered and a counter-electrode, and whereby the sputtered material is reacted in the vacuum atmosphere with an inlet reactive gas to form a not or low conductive material compound, and further a controlled discharge current path is provided across the plasma discharge stage and that there is provided across said discharge current path the DC signal generator and an interrupting switch unit, both connected in series, whereby the interrupting switch unit and the controlled discharge current path are closed in phase opposition.

XXXIV. A method preferably following a set of features as defined in XXXIII, whereby further, especially when the said DC signal generator has an output characteristic substantially according to a current source, the said interrupting switching unit is bridged by an electronic circuit, preferably made of passive elements, preferably made of resistances.

XXXV. A method which preferably follows a set of features as defined in XXXIII or XXXIV, whereby further the reactive sputtering process is operated in the oxidic or in the transition mode between metallic and oxidic operation mode.

XXXVI. A method which preferably follows the features as defined in one of the sets XXXIII to XXXV, whereby further silicon is sputtered and is reacted with oxygen for depositing a silicon oxide layer.

XXXVII. A method which preferably follows the features according to one of the sets XXXIII to XXXVI, whereby dielectric or low or semi-conductive layers are formed from material based on a metal.

XXXVIII. A method which preferably follows the features as defined in the sets I to XXI, XXXIII to XXXVII, whereby the further electric signal is applied intermittently and with a repetition rate according to a frequency of 50 Hz to 1 MHz (both limits included), preferably of 5 kHz to 100 kHz (both limits included), further preferred especially of 10 kHz to 20 kHz(both limits included).

XXXIX. A method which preferably follows features according to one of the sets I to XXXVIII whereby the said further electric signal is intermittently applied during time spans with extents of between 50 nsec and 10 $\mu$sec (both limits included) preferably of between 0.5 $\mu$sec and 2 $\mu$sec (both limits included) or of 2 $\mu$sec and 10 $\mu$sec (both limits included).

XL. A method for controlling the occupation with electrical chargecarriers of a surface of an object which surface is formed by a not or low conductive part of said object or by a not or low conductive covering of said object, whereby said object is deposited adjacent or on an electro-conductive surface and whereby the surface of said object is exposed to a vacuum atmosphere with electrical chargecarriers whereby a further electro-conductive surface is provided exposed to said vacuum atmosphere and a electrical charge is driven through said one electro-conductive surface, the said object with said surface, a region of said vacuum atmosphere and said further electro-conductive surface in a controlled manner whereby preferably a plasma-discharge is generated in said vacuum atmosphere.

XXXXI. A vacuum treatment apparatus with a vacuum recipient (3) therein a carrier arrangement for workpieces at which apparatus an electric signal generator is connected to at least (2a, 2b) electro-conductive surfaces which interact with said atmosphere in the vacuum recipient whereby the signal generator comprises a DC-signal generator (8) and a unit (12, 14, 14s, S$_1$) at the output side of the DC-signal generator by which unit the output signal of the generator (8) is controllably varied to generate an electric signal applied to said two electro-conductive surfaces (2a, 2b) whereby the said unit is so controlled or is so controllable (16, 160) that with a predetermined or adjustable repetition frequency and/or for predetermined or adjustable time-spans the signal applied to the said two surfaces is different from the output signal of the said DC-signal generator (8).

XXXXII. A vacuum treatment apparatus with a vacuum recipient (3) and therein a carrier arrangement for workpieces further with means for generating electrical charge-carriers in said recipient whereby two electro-conductive surfaces (2a, 2b) are in interaction with the atmosphere in the recipient (3) and are interconnected via a controllable discharge or charge exchange current path (14, 14s, S$_1$)

XXXXIII. A vacuum-treatment apparatus which preferably has the feature of the sets XXXXI and XXXXII whereby further the repetition rate and the control of said discharge or charge exchange current path are synchronized and at least one of the electro-conductive surfaces according to the apparatus as defined in XXXXI is that of the apparatus defined in the features of XXXXII.

XXXXIV. A vacuum-treatment apparatus which has preferably the features as defined in one of the sets XXXXI to XXXXIII whereby further the two electro-conductive surfaces (2a, 2b) are interconnected via a controlled short-circuiting unit (14s, S$_1$).

XXXXV. A vacuum-treatment apparatus which preferably has features as defined f or the apparatus according to XXXXIV whereby the short-circuiting switching unit (S$_1$) acts as well as the unit at the outputside of said DC-signal generator (8) an d as a control unit (14) in the discharge or charge exchange current path.

XXXXVI. A vacuum apparatus which preferably has the features of the apparatus according to one of the apparatus as defined in XXXXI to XXXXV whereby further one of the electro-conductive surfaces (29) forms a workpiece carrier surface of forms a surface (52, 2b) for supporting a source-material which source-material is used during a coating process at said apparatus of at least one workpiece (1).

XXXXVII. A vacuum apparatus which preferably has the features of an apparatus according to one of XXXXI to XXXXVI whereby one of the electro-conductive surfaces (2a) forms a workpiece carrier surface and the apparatus is a ionplating apparatus.

IIL. A vacuum treatment apparatus which preferably has the features of an apparatus as defined in one of the sets XXXXI to XXXXVI whereby further a target object (64) is provided which is sputtered and wherein one of said electro-conductive surfaces (2b) is contacting said vacuum atmosphere via the said target object (64).

IL. A vacuum treatment apparatus which has preferably the feature of the apparatus according to IIL whereby the target object is part of a magnetron arrangement.

L. A vacuum treatment apparatus which has preferably the features of the apparatus according to one of the sets XXXI to IL whereby means (52, 50, 3, 64) are provided to generate a plasma-discharge (PL) in the recipient.

LI. A vacuum treatment apparatus which preferably has the features of an apparatus as defined in one of the sets XXXI to L whereby at least one electrode-pair is provided to generate a plasma-discharge in the recipient and whereby preferably at least one of these electrodes (64) forms one of the said electro-conductive surfaces (2b).

LII. A vacuum treatment apparatus which has preferably the features of an apparatus as defined in one of the sets XXXXI to LI whereby further at least three (2a$_1$, 2a$_2$, 2b) of the said electro-conductive surfaces are provided and grouped at least in pairs and at least one generator (8) according to set XXXXI and/or a current path according to set XXXXII is provided to each group and relatively, controlled by means of a time-control-unit (70) staggered in time.

LIII. A vacuum treatment apparatus which has preferably the features of an apparatus as defined by the features of set LII whereby further more than two groups of electro-conductive surfaces are controlled in mutually time staggered manner by the time control unit.

LIV. A vacuum treatment apparatus which has preferably the features of an apparatus as defined in one of the sets XXXXI to LII whereby further a gasfeed arrangement (18) is provided in the vacuum recipient which gasfeed arrangement is linked to a reactive gas tank.

LV. A vacuum treatment apparatus which preferably has the features of an apparatus as defined by the features of one of the sets XXXXI to LIV whereby the apparatus is a PVD-apparatus or a reactive PVD-apparatus or an apparatus for plasma-enhanced CVD or an apparatus for thermical CVD with an arrangement for ionizing of a gasious part of said vacuum atmosphere in the recipient.

LVI. A vacuum treatment apparatus which has preferably the features of an apparatus defined by the features of one of the sets XXXXI to LV whereby further a low voltage glow discharge-stage is provided preferably with a glow electron-emitting cathode (50).

LVII. A vacuum treatment apparatus which has preferably the features of an apparatus as defined by one of the sets of features XXXXI to LVI whereby at least two electrodes (60a, 60b) are provided for generating a plasma (PL) in the vacuum recipient (3) and whereby at least one of these electrodes (60b) is connected to the electrical potential of one of the said electro-conductive surfaces (62).

LVIII. A vacuum treatment apparatus which preferably has the features of an-apparatus as defined by one of the sets of features XXXXI to LVII whereby the controlled discharge or charge exchange current path is capacitive (C$_I$, C$_D$, C$_{D1}$) when this path is controllably closed.

LIX. A vacuum treatment apparatus which has preferably the features of an apparatus as defined by one of the sets XXXXI to LVIII whereby an electrical charge storage (C$_D$, 20, C$_{D1}$) is provided in the discharge current path and/or a voltage source (U$_E$).

LX. A vacuum treatment apparatus which has preferably the features of an apparatus as defined in one of the sets XXXXI to LIX whereby further a measuring arrangement (24, 32, 66) is provided along for measuring a signal representative for a current flowing through said controlled discharge or charge exchange current path.

LXI. A vacuum treatment apparatus which has preferably the features according to an apparatus as defined in set LX whereby the output signal of the measuring arrangement acts on an adjusting means (30, 16, 160, 56, 73) for controlling said control-discharge or charge-exchange current path.

LXII. A vacuum treatment apparatus which has preferably the features of an apparatus as defined in one of the sets LX or LXI whereby the output of the measuring arrangement acts on a threshold sensitive unit (26) with preferably adjustable threshold value (W) the output thereof being led to a control input (30, R) for said control discharge or charge exchange current path.

LXIII. A vacuum treatment apparatus which has preferably the features of an apparatus as defined by at least one of the sets LX to LXII whereby further the output of the measuring arrangement possibly via an analogue to digital converter (34) acts on an actual value storage means (36) the output of which being led to one input of a comparison unit (38) as well as the output of a rated value storage means (40) and that the output of the comparison unit (38) acts on a control input of said controlled discharge or charge exchange current path.

LXIV. A vacuum treatment apparatus which has preferably the features of an apparatus as defined according to one of the sets XXXXI to LXIII whereby a controlled or controllable source of electric charge (20, 22, 44, 58, $C_{D1}$) is provided on an electric path between the said two electro-conductive surfaces (2a, 2b) especially during time-spans in which the said controlled discharge or charge-exchange current path is controllably interrupted or controlled to become high-ohmic.

LXV. A vacuum treatment apparatus which preferably has a feature of an apparatus as defined by one of the sets XXXXI to LXIV whereby further a capacitive element ($C_{D1}$) is connected to at least one of the said electro-conductive surfaces (2a, 2b) in said current path and further comprising means (46, 46a, 58) for electrically charging the serial connection of said capacitive element ($D_{D1}$) with the oneport formed between said two electro-conductive surfaces (2a, 2b) whereby said capacitive element appears in electrical parallelism to said oneport when said current path is controllably closed.

LXVI. A vacuum treatment apparatus which comprises preferably the features of an apparatus as defined in one of the sets of features XXXXI to LXV whereby a capacitive element ($C_{D1}$) is electrically connected to at least one of the electro-conductive surfaces (2a) and that when the said current flow path is controlled to be high-ohmic or interrupted the oneport defined between the two electro-conductive surfaces (2a, 2b) is connected in series with the said capacitive element and a voltage'source (58) is as well in series thereto which source generates an output signal controllably varying in time or adjustably varying. in time (dU/dt) so that by the said serial connection and as a function of the variation of said output signal of said voltage source in time there flows through said serial connection a controlled or adjustable current.

LXVII. A vacuum treatment apparatus preferably with the features of an apparatus as defined in one of the sets, of features LXV to LXVI whereby means are provided to charge said serial circuit which comprise inductive means ($L_{66)}$.

LXVIII. A vacuum treatment apparatus preferably with the features of an apparatus as defined in at least one of the sets of features XXXXI to LXVI whereby the apparatus is an ionplating apparatus and one of the said electro-conductive surfaces (2a) forms the carrier for workpieces (1) and whereby via a capacitive element ($C_{D1}$) and a control switching unit ($S_1$) a discharge current path is formed between the said conductive surfaces (2a, 2b) and the DC signal generator (8) is connected in parallel to said switching unit ($S_1$) and whereby preferably a source of electric charge (58, $D_{D1}$) acts in series to said switching unit ($S_1$) and said capacitive element ($C_{D1}$) or that a charge source comprises said capacitive element ($C_{D1}$) whereby operation of said source of electric charge is synchronized with the operation of said switching unit ($S_1$) so that when said switching unit ($S_1$) is open a predetermined or adjustable charging current is generated to and from said electro-conductive surfaces (2a, 2b).

LXIX. A vacuum treatment apparatus preferably comprising the features of an apparatus as defined in the set of features LXVIII whereby more than one, preferably more than two of the electro-conductive surfaces ($2a_x$) acting as workpiece carriers are provided and wherein, respectively, a switching unit is provided to each of said electro-conductive surfaces acting as workpiece carriers to form, respectively, a discharge current path and therein a capacitive element ($C_{D1}$) and, preferably, a source of electric charge (58, $C_{D1}$) or a source of electric charge is formed with said capacitive elements ($C_{D1}$) whereby a time control unit (162, 71) is provided which operates the switching units ($S_1$) in a mutually time staggered manner.

LXX. A vacuum treatment apparatus preferably construed with the features of an apparatus as defined by one of the sets of features XXXXI to LXIX whereby there is provided in the recipient a sputtered target object (64) at which there is provided one of the said electro-conductive surfaces (2b) whereby the two electro-conductive surfaces (2a, 2b) are linked by a controlled switching unit ($S_1$) to form a control discharge current path and further a DC-signal generator (8) is provided with a switching unit ($S_2$), in series to its output whereby the switching units ($S_1$, $S_2$) are intermittently operated under the control of a time control unit (160) in phase opposition.

LXXI. A vacuum treatment apparatus preferably construed with the features of an apparatus as defined by the set of features LXX whereby detection means are provided to detect arcing so e.g. flash-overs and break-throughs within the recipient (3) and that the output signal or said detection means acts on a first input of a comparator unit (70), the output signal of a rated value generating unit (72) being led to a second input of said comparison unit, the output signal of said comparison unit (70) acting on an adjusting unit and preferably on a control input of a time control unit (16, 160) which latter adjusts the intermittent operation of the switching unit ($S_1$).

LXXII. A vacuum treatment apparatus preferably with the features of an apparatus as defined in at least one of the sets of features XXXXI to LXXI the apparatus being an apparatus for producing optical layers on workpieces.

LXXIII. An apparatus preferably construed with features of an apparatus as defined by the sets of features LXXII whereby the apparatus comprises at least one sputtered target object (64).

LXXIV. A vacuum treatment apparatus which preferably comprises the features of an apparatus as defined in one of the sets of features XXXXI to LXXI the apparatus being an apparatus for the production of hard material and/or wear-protective coatings.

LXXV. A vacuum treatment apparatus which is preferably construed with the features of an apparatus as defined by the set of features LXXIV whereby the apparatus is an ionplating apparatus.

What is claimed is:

1. A method for manufacturing at least one object using a vacuum treatment, the method comprising the steps of:
supporting at least one object on a workpiece carrier arrangement within a vacuum recipient containing an atmosphere;
generating in said vacuum recipient electrical charge carriers which are of a type that form electrically insulating material;
providing in said vacuum recipient with said object at least two electroconductive surfaces;
controllably changing a charge or discharge current loop operationally bridging said electroconductive surfaces in a time-controlled manner to have high ohmic resistance during first time spans and lower ohmic resistance during second time spans and thereby discharging a voltage between said electroconductive surfaces due to electrical charge carriers in said atmosphere through said current loop during said second time spans; and controlling said first and second time spans to occur repetitively, thereby preventing arcing at parts of said electroconductive surfaces, which are or which are becoming electrically isolated from said atmosphere by some of said electrical charge carriers deposited as an insulating material thereon.

2. A method according the claim 1, including applying a DC power signal to at least one of the electroconductive surfaces during the first time spans, the first time span being longer than the second time span.

3. A method according the claim 1, including bridging said at least two electroconductive surfaces with the high ohmic resistance during the first time spans during which electrical charge carriers cover at least one electroconductive surface, and by a lower ohmic resistance during the second time spans to discharge electrical charge carriers in the atmosphere during the second time spans to prevent arcing.

4. A method according the claim 1, including short-circuiting the at least two electroconductive surfaces to each other during the second time spans to discharge electrical charge carriers in the atmosphere during the second time spans to prevent arcing.

5. A method according the claim 4, including applying a DC power signal to at least one of the electroconductive surfaces during the first time spans, the first time span being longer than the second time span.

6. A method according the claim 5, including chopping the DC power signal during the second time spans.

7. A method according the claim 1, wherein the treating of the object comprises ion plating the object.

8. A method according the claim 7, wherein the work piece carrier arrangement includes one of the electroconductive surfaces for supporting the object, the ion plating comprising covering the object with the charge carriers.

9. A method according the claim 1, including generating a plasma in the vacuum recipient for use during the treating of the object.

10. A method according the claim 9, wherein the plasma is generated from one of the electroconductive surfaces.

11. A method according the claim 1, including supplying a reactive gas to the recipient.

12. A method according the claim 1, including supplying material for coating the object during the treating, from one of the electroconductive surfaces.

13. A method according the claim 12, wherein the one of the electroconductive surfaces which supplies material for coating is a sputtering target for a sputter treatment in the recipient.

14. A method according the claim 1, including measuring at least one parameter that is indicative of the start of an arcing at the electroconductive surface being covered by the insulating material, and using the measuring for adjusting said first and second time spans to prevent arcing.

15. A method according the claim 14, including comparing the value of the parameter measured during the measuring step to a rated value for the parameter which is known to indicate a starting of an arc, and using the comparing step to adjust the first and second time spans.

* * * * *